(12) United States Patent
Roberts

(10) Patent No.: US 11,379,376 B2
(45) Date of Patent: Jul. 5, 2022

(54) EMBEDDING DATA IN ADDRESS STREAMS

(71) Applicant: Micron Technology, Inc., Boise, ID (US)

(72) Inventor: David Andrew Roberts, Wellesley, MA (US)

(73) Assignee: Micron Technologies, Inc., Boise, ID (US)

( * ) Notice: Subject to any disclaimer, the term of this patent is extended or adjusted under 35 U.S.C. 154(b) by 113 days.

(21) Appl. No.: 16/879,688

(22) Filed: May 20, 2020

(65) Prior Publication Data

US 2021/0365380 A1 Nov. 25, 2021

(51) Int. Cl.

| | |
|---|---|
| *G06F 11/10* | (2006.01) |
| *G11C 5/06* | (2006.01) |
| *G06F 12/0882* | (2016.01) |
| *G06F 12/0868* | (2016.01) |
| *G06F 9/54* | (2006.01) |
| *G06F 11/30* | (2006.01) |
| *G06F 9/50* | (2006.01) |
| *G01R 31/317* | (2006.01) |

(52) U.S. Cl.
CPC ........ *G06F 12/0882* (2013.01); *G06F 9/5016* (2013.01); *G06F 9/546* (2013.01); *G06F 11/1004* (2013.01); *G06F 11/1068* (2013.01); *G06F 11/3037* (2013.01); *G06F 12/0868* (2013.01); *G11C 5/066* (2013.01); *G01R 31/31713* (2013.01)

(58) Field of Classification Search
None
See application file for complete search history.

(56) References Cited

U.S. PATENT DOCUMENTS 4,791,356 A * 12/1988 Warren ............ G01R 31/31915
324/73.1
5,875,470 A 2/1999 Dreibelbis et al.
(Continued)

FOREIGN PATENT DOCUMENTS

WO 2017184497 10/2017

OTHER PUBLICATIONS

Lee et al. "An Off-Chip Attack on Hardware Enclaves via the Memory Bus." Dec. 2019. arXiv.*
(Continued)

*Primary Examiner* — Nathan Sadler
(74) *Attorney, Agent, or Firm* — Colby Nipper PLLC

(57) ABSTRACT

Techniques and devices are described for embedding data in an address stream on an interconnect, such as a memory bus. Addresses in an address stream indicate at least part of a location in memory (e.g., a memory page and offset), whereas data embedded in the address stream can indicate when metadata or other information is available to lend context to the addresses in the address stream. The indication of data in the address stream can be communicated using, for example, a mailbox, a preamble message in a messaging protocol, a checksum, repetitive transmission, or combinations thereof. The indication of data can be recorded from the address stream and may later be used to interpret memory traces recorded during a test or can be used to communicate with a memory device or other recipient of the data during testing or regular operations.

21 Claims, 9 Drawing Sheets

(56) References Cited

U.S. PATENT DOCUMENTS

| | | | |
|---|---|---|---|
| 5,898,848 | A | 4/1999 | Gulick |
| 6,173,392 | B1 | 1/2001 | Shinozaki |
| 6,938,132 | B1 | 8/2005 | Joffe et al. |
| 7,162,567 | B2 | 1/2007 | Jeddeloh |
| 7,430,650 | B1 | 9/2008 | Ross |
| 7,603,603 | B2 | 10/2009 | Dubey |
| 9,076,515 | B2 | 7/2015 | Jeon |
| 9,286,221 | B1 | 3/2016 | Sundarajan et al. |
| 9,287,008 | B2 | 3/2016 | Tong |
| 9,767,028 | B2 | 9/2017 | Cheng et al. |
| 9,934,148 | B2 | 4/2018 | Roberts et al. |
| 10,289,555 | B1 | 5/2019 | Michaud et al. |
| 10,877,889 | B2 | 12/2020 | Roberts |
| 10,877,894 | B2 | 12/2020 | Roberts |
| 2001/0049772 | A1 | 12/2001 | Choi et al. |
| 2007/0067382 | A1 | 3/2007 | Sun |
| 2009/0224784 | A1* | 9/2009 | Pagani ............... G01R 31/2841 324/762.02 |
| 2010/0268893 | A1 | 10/2010 | Luttrell |
| 2011/0250768 | A1 | 10/2011 | Springer et al. |
| 2012/0054425 | A1 | 3/2012 | Matas |
| 2015/0318059 | A1 | 11/2015 | Dragula et al. |
| 2016/0048452 | A1 | 2/2016 | Gill et al. |
| 2016/0203081 | A1 | 7/2016 | Kimura |
| 2017/0353576 | A1 | 12/2017 | Bernat et al. |
| 2019/0004954 | A1 | 1/2019 | Kumar et al. |
| 2019/0138630 | A1 | 5/2019 | Drerup et al. |
| 2019/0164615 | A1 | 5/2019 | Kim |
| 2019/0252009 | A1 | 8/2019 | Kang et al. |
| 2020/0363986 | A1 | 11/2020 | Roberts |
| 2020/0364146 | A1 | 11/2020 | Roberts et al. |

OTHER PUBLICATIONS

PCI Express. PCI Express Base Specification. Dec. 2015. Rev. 3.1a. pp. 46-90, 164-170.*

NVM Express. NVM Express. May 2017. Rev. 1.3. pp. 6-12, 55-61.*

"International Search Report and Written Opinion", Application No. PCT/US2020/028939, dated Jul. 30, 2020, 8 pages.

"Non-Final Office Action", U.S. Appl. No. 16/414,485, filed Sep. 25, 2020, 11 pages.

"Notice of Allowance", U.S. Appl. No. 16/414,485, filed Nov. 12, 2020, 10 pages.

"Notice of Allowance", U.S. Appl. No. 16/414,518, filed Nov. 12, 2020, 26 pages.

"Restriction Requirement", U.S. Appl. No. 16/414,518, filed Aug. 28, 2020, 8 pages.

Jain, et al., "Back to the Future: Leveraging Belady's Algorithm for Improved Cache Replacement", Jun. 2016, 12 pages.

Khan, et al., "Sampling Dead Block Prediction for Last-Level Caches", Dec. 2010, 12 pages.

Kondguli, et al., "Division of Labor: A More Effective Approach to Prefetching", Jun. 2018, pp. 83-95.

Nesbit, et al., "AC/DC: An Adaptive Data Cache Prefetcher", Jan. 2004, 11 pages.

Peled, et al., "Semantic Locality and Context-based Prefetching Using Reinforcement Learnin", May 2015, pp. 285-297.

"International Search Report and Written Opinion", Application No. PCT/US2021/030947, dated Aug. 20, 2021, 11 pages.

* cited by examiner

EMBEDDING DATA IN ADDRESS STREAMS

BACKGROUND

New designs for memory devices are being developed to enable faster, less-expensive, or more-reliable computing. To ensure that a new memory design will function as expected, the memory design is tested. For example, analyzing signal traces of a memory bus that is coupled to a memory device can help when evaluating a new memory design. A testing apparatus attaches physical probes to pins or wires on the memory bus and provides input to a logic analyzer that records signals as they appear on the memory bus during a memory test. The recorded signals can be input to a simulator for replaying how the new memory design functions in response to memory requests made during the test. This testing process has become more challenging, however, as memory devices have become more complex.

BRIEF DESCRIPTION OF THE DRAWINGS

The details of one or more aspects of embedding data in address streams are described in this document with reference to the following drawings. The same numbers are used throughout the drawings to reference like features and components.

FIGS. 2-1 and 2-2 each illustrate an example scheme in which a mailbox is referenced by data in an example address stream.

FIGS. 5-1 and 5-2 illustrate additional example environments in which various techniques and devices described in this document can operate.

DETAILED DESCRIPTION

Overview

Figure 1:
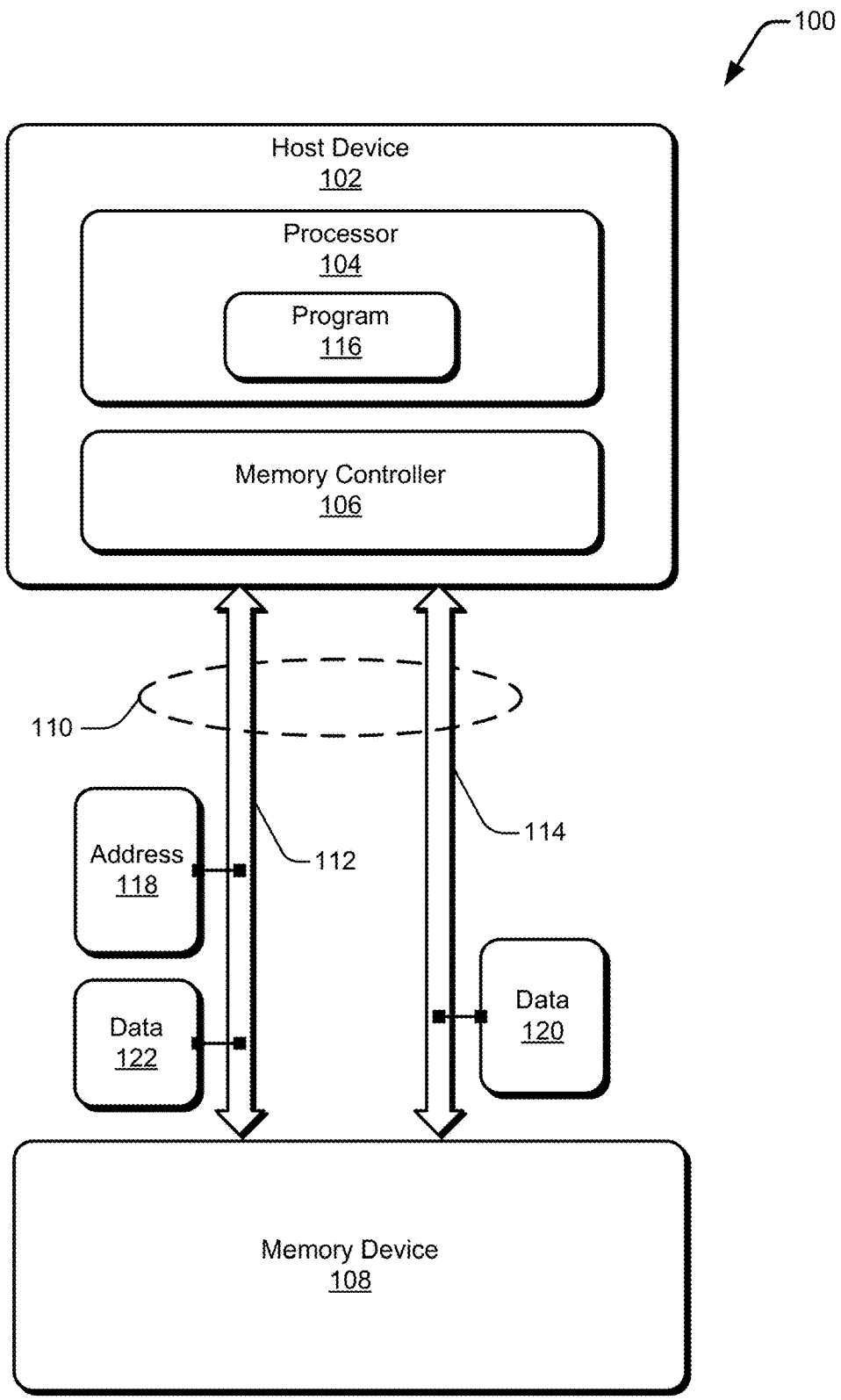
FIG. 1 illustrates an example computer in which various techniques and devices described in this document can operate.

Techniques and devices are described for embedding data within an address stream on an interconnect, such as a memory bus of a computer. Here, physical lines that communicate an address stream can be made to communicate data, which is interspersed amongst or referenced through bits of the address stream. Address lines of the interconnect can be dedicated or selectively employed to propagate the address stream (e.g., in a time-division manner that is shared between the address stream and a data stream). Bits of the address stream typically convey addresses (e.g., memory pages and offsets) used in execution of read or write operations; data to be read or written during their execution, however, is communicated separately through a data stream, which may be on different physical lines than the address stream. To avoid complexities in tracing a data stream contemporaneously with tracing an address stream and any command lines, the address stream is configured to occasionally carry data, which can then be automatically recorded as part of a trace of the address stream. Data detected from within this extra, logical data channel can be used to enhance the addresses and other information obtained in the memory trace, for example, to perform a function or to determine data and control dependencies, even without monitoring the data stream.

A program or system state, a thread identifier or process identifier, an instruction or program counter, and a function or task identifier are some examples of data that can be directly embedded in an address stream. To indirectly communicate the embedded data through the address stream, this data can include a pointer or reference to a mailbox or other portion of memory, which is allocated for the purpose of communicating data through the address stream.

Consider a test engineer or technician evaluating a memory for a computer through signal-trace-analysis and a memory-system simulation. Software instrumentation executing at a host or memory device may output a memory trace to a data file. Alternatively, physical probes attached to command lines or address lines may be used to send signals to a recipient that records the signals of the address stream as a trace, typically, however, without recording a corresponding data stream. The recipient of the memory trace may be a program, a logic analyzer, a routine, a system on chip (SoC), or another component or entity. The output received from the probes or software instrumentation can be recorded by the recipient in association with timestamps. The recorded signals or data file may be fed to the memory-system simulation for subsequent playback and signal-trace-analysis. The simulation's playback of the command lines and address stream offers insight into how the memory design performs when connected to a host of a computer.

Existing logic analyzers or other recipients of probed signals have a finite number of input channels. Generating a complete memory trace, including both the address stream as well as a corresponding data stream, if even possible, would require a complex logic analyzer, an excessive number of probes, and significant storage space. Useful control dependencies may be discoverable from inspection of the data stream; however, it may not be feasible to trace the data stream while also tracing the address stream and control lines because of limitations in probing or monitoring by a recipient. Ignoring the data stream is one way to curtail costs and complexities in performing signal-trace-analysis. Unfortunately, without the data stream, some data or control dependencies are undiscoverable during simulation playback. Moreover, a computer system often runs multiple programs (e.g., applications, processes) and threads with interleaved memory activity. It is therefore difficult to precisely correlate software events with memory activity without having context about the data as well as the addresses of memory activities appearing on the memory bus.

An example computing system described herein injects data directly into the address stream or indirectly by injecting an indication of the data in the address stream. The data may provide context for addresses appearing within the address stream at that point in time. The context can be recorded for use during subsequent playback and/or analysis, without requiring additional instrumentation, probes, lines, wires, pins, or other hardware, beyond that which is already used to monitor an address stream. The data can also be used to convey other information, such as a message from a program executing at the host device to a memory device or other recipient of the address stream, without modifying hardware. The data can be used to convey control dependencies, which can be used to produce more-accurate simulations, for example. When output on existing address wires of an address bus, the embedded data can be useful to validate a new memory or to control a memory in ways that addresses cannot. As such, although normally an address stream only includes addresses, the computing system is configured to occasionally embed data within its address stream, directly or indirectly, and in accordance with certain principles described herein.

The example system includes a host device connected to a memory device over an interconnect. The host device regularly sends signals over the interconnect, for example, by transmitting an address stream and control commands on address and control lines, and by transmitting a corresponding data stream on data lines. The host device sends an indication of data through the address stream, which to a logic analyzer or other recipient appears like any other address on the memory bus. The host device outputs the data onto a hidden channel, which is conceptually overlaid on the address lines and interspersed within the address stream.

Probing the address lines to trace the address stream likewise traces the data that the host device sends through the hidden channel. As such, when monitored, the data or indication of data within the hidden channel is traced in the same way addresses outside the hidden channel are preserved. To a recipient of the address stream, this embedded data can provide context or clues for debugging or for determining how the system performs. From the data, control or data dependencies, which are normally undiscoverable without a trace or understanding of a corresponding data stream, are identifiable from the trace of the address stream.

The embedded data can supplement or enhance a memory-system simulation. For example, a logic analyzer monitoring an address stream can control a function (e.g., an alarm or alert) based on the data obtained from the address stream. During playback, the simulation can omit, from a memory trace, memory traffic related to the data if the omission is desirable to conceal (e.g., from an analyzer) that data was communicated in the address stream. The memory traffic revealed during signal-trace-analysis and simulation playback can be excluded to prevent an incorrect simulation playback; memory traffic referencing embedded data may be subtracted from a memory trace before playback. While the data extracted from the address stream may be omitted from the simulated playback of the address stream, the data can be output alongside the addresses of the address stream, which can improve fidelity of a memory-system simulation. Sending data through an address stream using the techniques and devices described herein is not limited to improving memory-system simulations, however.

The techniques and devices additionally or alternatively allow data to be embedded in an address stream at any time, and for any reason, not merely to support test and evaluation. For example, some memory architectures specify dedicated input and output channels to pass tracking information over a memory bus between a host device and a memory device. Other memory devices may provide internal registers that obtain contextual data written by a host device, e.g., prefetch hints or non-cacheable address flags, which the memory devices use to complete memory operations. Although both techniques enable data communication, both also add complexity to hardware of the system, which can greatly add to costs. In contrast, a host device of an example computing system can convey data on the address lines of a memory bus, including whenever a physical sideband channel or access to a data stream is not available.

As mentioned, data can be directly or indirectly injected into the address stream. Data may be communicated directly within the address stream by causing the host device to invoke a software library function that automatically manipulates addresses being sent on the memory bus, so the addresses convey an indication of data. The software library can include an initialization function, which, when called by the host device, sends a recipient of the address stream (e.g., a memory device) information about when or how data, if embedded, will appear in the address stream. Initialization may not be necessary; performance, however, can be improved through initialization in some scenarios by effectively priming the recipient to recognize data when the data appears in the address stream. After initialization, the host device can call a send-message or send-packet function of the software library to embed in the address stream data that is input as a parameter to the function. Alternatively, the host device may use the described techniques and methods to communicate commands or other information to the memory device using data embedded in an address stream.

The indication of data embedded in an address stream may itself represent bits of information or metadata that appear to be addresses but that are not referenced to a mailbox location. If, however, a mailbox is used, a program can pre-allocate a memory area as the mailbox and share the mailbox location with the memory device, logic analyzer, or other recipient of the embedded data. This way, there does not need to be any upfront coordination between the recipient and the host device. Instead, whenever an address into the already-allocated mailbox is identified within the address stream, the recipient treats the offset bits embedded data due to the reference to the mailbox. Because the memory of the mailbox is privately allocated and owned by the program, and because the size of the mailbox may be small and contained to only one or a few pages in memory, there will likely not be any interfering or unintended memory requests within the mailbox. By establishing a mailbox and/or communicating using a checksum—which is described below, any program can establish a reliable and private mailbox for application-specific data, for example.

Embedding data directly within an address stream can be effective to transmit data from a host device to a recipient. A processor or a memory controller of a host device, or a component of a memory device, may act on data communicated through an address stream, such as by directing caches, prefetchers, or other hardware of the computer or by executing a processing-in-memory (PIM) operation. If probing the address stream, a separate physical test probe is not necessary to extract the embedded data. The recipient may include logic that recognizes a transmission of data appearing in an address stream. By monitoring the address portion of a memory bus, the logic may identify data in response to identifying a particular address pattern, which was not initiated by a test program.

Another way to embed data through an address stream is by indirectly embedding the data, such as by establishing a mailbox. Using a mailbox increases the throughput of the hidden channel, as more data can be conveyed via the mailbox in a shorter amount of time or in fewer memory-bus cycles than if the data is embedded directly. To embed data indirectly within an address stream, a program can cause a host device to allocate a contiguous portion of memory equal to an intended size (e.g., a four-kilobyte page) for the mailbox. The program may repeat a pattern of addresses (e.g., a page address with one or more offsets) in the address stream, within a particular window (e.g., a window based on time or number of address entry transmissions), to indicate where the mailbox is being designated for future data transmissions. When the pattern appears in the address stream within the allowed window, the memory or other recipient of the address stream automatically determines that all subsequent addresses that reference a page or pages of memory containing the mailbox are indications of data embedded by the program. For example, rather than an address, the address stream may carry bits that reference the mailbox and include offset bits having the embedded data. The embedded data can be obtained from the mailbox by detecting within the address stream the mailbox location (e.g., a page and/or offset of an address) and extracting the associated offset as the embedded data. A mailbox may not, however, be necessary in some example computing systems.

Optionally, an indication of data embedded in an address stream may include a checksum posing as one of the addresses within the pattern of addresses used to convey the data or the indication of data. The checksum enables the recipient to determine a correct order to parts of the data, for example, when transmission of an indication of data requires multiple memory cycles of the address stream. The ability to reorder parts is helpful in case the order is altered based on how the memory bus is managed by the memory controller of the host device and/or the memory device, each of which may be outside a sender program's control. The checksum fails if no combination of addresses in a group of addresses within the address stream can be ordered to satisfy a checksum equal to a remaining address in the group. A checksum may not be necessary in some example computing systems where reliability or the likelihood of reordering is less of a concern.

Also described herein is a messaging protocol that can be implemented independent of, or in combination with, a mailbox and checksum to convey an indication of data embedded within an address stream. The messaging protocol includes a preamble or postamble message, either of which is identifiable from a repeating pattern of addresses in the address stream, similar to identifying a mailbox. The preamble or postamble messages bound the program's indication of data, which appears as a payload message distributed across one or more memory cycles of the address stream. The preamble message represents a header or start of the payload message, and the postamble message conveys an end or tail of the payload message. Non-cacheable byte read or write instructions executed by the program can cause the repeating patterns associated with the preamble or postamble messages to be identifiable within the address stream, as a predefined distribution of addresses or a predefined distribution of deltas (e.g., inter-address differences) between addresses.

The payload message includes a sequence of addresses that encode the indication of data. The sequence of addresses belonging to the payload message appear in the address stream, after the preamble message and before the postamble message if one or both are used. These address sequences are uncommon; each has almost no chance of occurring on the memory bus as part of a series of regular memory requests. The unique sequences are thus readily detectable by a recipient of the address stream, such as a memory device or a trace-reader program. As mentioned, addresses that make up the sequence in the payload message may be reordered on the memory bus, for instance, by a memory controller. The correct sequence of addresses is attainable if the payload message includes a checksum, from which the correct order of addresses can be derived.

The messaging protocol may use a mailbox to support indirect communication of data through the address stream. Referencing the mailbox enables a sender to avoid wasting memory cycles by constantly repeating a preamble or postamble message. A program can directly embed a payload of data within the address offset bits within an address stream, for example, including one or more least-significant-bits (LSBs). Instead of actual data, the payload can represent a pointer (e.g., an address to a physical page of memory) for the mailbox that is referenced to communicate the desired data. The program may output the payload message with the mailbox-pointer between sending the preamble and postamble messages if both are used. The trace-reader program, the memory device, or other recipient of the address stream can therefore determine from the payload the page of memory allocated to the program for the mailbox. A subsequent payload message, even without a preamble or postamble message, can reference the mailbox page automatically to trigger the recipient to identify data, indirectly, by extracting the bits from an offset within a mailbox page of memory.

In some cases, a program writes data to a mailbox at runtime to communicate with a recipient. The recipient of the address stream obtains data from the mailbox when the mailbox page appears in the address stream. The mailbox can be monitored without the overhead of communicating and interpreting preamble or postamble messages once the mailbox is established. Devices monitoring the address stream can trigger internal functions that act on embedded data in response to identifying an address within the mailbox (e.g., the address of a memory page) from the address stream.

Using a predetermined mailbox, rather than establishing the mailbox through the messaging protocol, enables the sender and recipient to begin encoding and decoding embedded data more-quickly. Predetermining the mailbox avoids having to exchange a preamble message or postamble message, either of which can be anywhere in the address stream, as well as interleaved with many other unrelated memory requests. Predetermining a mailbox that is already allocated to the program may be simple and effective for some systems; however, other example systems may further promote stability, reliability, and security by bounding each payload of data with a preamble or postamble using the messaging protocol.

Whether established ahead of time or through the messaging protocol, once the location of a mailbox is determined, data can be retrieved from an address stream by accessing (e.g., reading from or writing to) the mailbox's page or other memory location. For example, the LSBs of an address to a four-kilobyte-sized page can contain up to twelve bits of data in each address of an address stream recorded for a memory trace. The minimum size of a memory (e.g., a DRAM DIMM) data transfer (sometimes referred to as a "burst") may be sixty-four ($2^6$) bytes. These six LSBs for the burst may not be communicated on the memory bus during a read or write operations. For write operations, the mailbox can be identified by monitoring write-byte-mask bits to get the LSBs back. Or if using reads, because each page may be $2^{12}$ bits, each offset may communicate six (i.e., twelve minus six) bits of data per read.

Because it may be desirable to work with eight-bit checksums, for ease in encoding or decoding them in a computer system, some implementations may use a mailbox size larger than a 4 Kb page (e.g., four times larger) to reduce the number of bits used to identify the mailbox and to increase the quantity of bits used for the payload by two bits, i.e., $\log_2(4)$. To achieve an eight-bit checksum, four pages of four kilobytes of memory per page may be used as a mailbox with a 16 KB size. The payload messages that result from a 16 KB mailbox are eight-bit "byte-sized" offsets within the mailbox, whether a given offset contains desired data or a checksum, either of which can be eight bits in such implementations. Therefore, allocating a larger mailbox that is greater in size than a single 4 KB page can increase the number of offset bits available to convey embedded data, and doing so may ensure each data item or checksum in a payload message can occupy a desired number of bits, such as a byte.

Example Environment

FIG. 1 illustrates an example computer 100 in which various techniques and devices described in this document can operate. The computer 100 includes a host device 102, which has one or more processors 104 and at least one memory controller 106, and a memory device 108 (referred to simply as "a memory 108"). In some examples, memory controller 106 may be an aspect of, and may reside on or within, the one or more processors 104. The computer 100 further includes an interconnect 110, which may be implemented as, for instance, a memory bus 110. The computer 100 can be any type of computing device, computing equipment, computing system, or electronic device which can utilize a channel for embedding data in an address stream.

As shown, the host device 102 and the memory device 108 are each coupled to the memory bus 110. Thus, the host device 102 and the memory device 108 are coupled one to the other via the memory bus 110. The processors 104 execute instructions that cause the memory controller 106 of the host device 102 to send signals on the memory bus 110. The host device 102 is configured to send an indication of data, such as a preamble message, a postamble message, a payload message, or the like as later described, within an address stream communicated on the memory bus 110. This communication can include addresses as well as an indication of data, sent over the memory bus 110 as part of an address stream 112. Put another way, the data refers to information other than a memory address for a (read or write) memory request. An indication of the data therefore, includes any machine or human recognizable feature, which appears in the address stream 112 to convey data, specifically, data other than an address to support a read or write memory request.

Thus, the memory bus 110 can include or provide a conduit for an address stream 112 or a data stream 114, or both. The address stream 112 includes or can be realized using a group of address wires, and the data stream 114 can encompass a different group of wires of the memory bus 110, referred to as data wires herein. The memory bus 110 can include additional wires or wireless connections; for example, a wired or wireless control bus may carry status or command signals exchanged between the host device 102 and the memory 108. Alternatively, the interconnect or memory bus 110 can propagate both the address stream 112 and the data stream 114 at least partially over the same physical wire or wires. As some examples, the interconnect 110 can include a front-side bus, a memory bus, an internal bus, peripheral control interface (PCI) bus, etc. If the interconnect or memory bus 110 includes a command bus or propagates a command stream, the host device 102 can also or instead propagate data over the command bus or command stream.

The processors 104 execute a program 116 and, through the memory controller 106, read from and write to the memory 108. Executing the program 116 configures the processors 104 and the memory controller 106 of the host device 102 to communicate data 122 in the address stream 112 and on the memory bus 110 that is shared with the memory 108. The processors 104 may include or may be the computer's: host processor, central processing unit (CPU), graphics processing unit (GPU), artificial intelligence (AI) processor (e.g., a neural-network accelerator), or other hardware processor or processing unit.

The memory 108 is illustrated as a memory for the computer 100; however, the memory 108 can be integrated within the host device 102 or separate from the computer 100 and/or can be of various types. For example, the memory 108 can include an integrated circuit memory, dynamic memory, random-access memory (e.g., DRAM, SRAM), or flash memory to name just a few. Any addressable memory having identifiable locations of physical storage can be used as the memory 108. Further, although the host device 102 and the memory device 108 are depicted as being discrete components, the host device 102, the memory device 108, and the interconnect 110 may alternatively be integrated on a single die (e.g., as an SoC).

A module referred to as the program 116, as well as any other module described herein, may be stored in a computer-readable media or other hardware components of the computer 100. Each module, including the program 116, represents a set of processor-executable instructions, including software instructions, firmware instructions, or a combination thereof.

Responsive to the processors 104 executing the instructions defining the program 116, the host device 102 is configured to communicate the data 122 in the address stream 112 of the memory bus 110, which is shared between at least the memory 108 and the host device 102. For example, as part of a conventional memory-write or read command issued during a first frame of memory traffic on the memory bus 110, the program 116 causes the processors 104 and the memory controller 106 to output addresses 118 in the address stream 112 and to output data 120 within the data stream 114. The data 120 may indicate what the memory 108 is to store at the addresses 118 included in the address stream 112, and alternatively, for a read, the data 120 may indicate what the memory 108 reads in the address specified in the address stream. The memory 108 executes the write or read command by storing the data 120 received on the data stream 114 in a storage location of the memory 108 that is defined by the addresses 118.

In some implementations, in a subsequent frame of traffic on the memory bus 110, which is described next, the program 116 directs the processors 104 and the memory controller 106 to output data 122 in the address stream 112. The memory 108 or (as later described) a logic analyzer, which is internal or external to the computer 100, is configured to determine the data 122 communicated through the address stream 112 between the memory 108 and the host device 102. The data 122 is not interpreted to be a memory address for a read or write command, which is the case for the addresses 118 and the data 120. Instead, the data 122 represents a payload of information, metadata in some cases, or a mailbox location through which information, such as metadata, is to be communicated.

In response to detecting the data 122, the memory 108 may use the data 112 to perform a function, such as a PIM operation. A hidden channel embedded within the address stream 112 therefore provides an additional communication path between the memory controller 106 of the host device 102 and the memory 108. When fed into a memory simulator or other platform used for processing the address stream 112, the data 122 may cause the memory simulator or other platform to output or display an indication of the data 122, for example, during playback and trace-analysis. An engineer or tester can consider the data 122 to aid in interpreting a trace of signaling on the memory bus 110 or to memory issues associated with portions of the program 116. A simulator or other processing platform, including the program 116, can use the data 122 to determine data or control dependencies between memory requests, which can enable more accurate simulation output.

The data 122 may include a program context indication, such as a thread identifier (TID) or a pointer to a longer thread identifier. The program 116 can inject the thread identifier into the hidden channel within the address stream 112 as the data 122. For example, the thread identifier categorizes prior memory requests involving the addresses 118 and the data 120, which appeared earlier in the trace. Alternatively, the thread identifier can precede the relevant memory requests in the address stream 112. As a function of the program 116, the program 116 can periodically direct the processors 104 to send the data 122. When implemented at an operating system level, an operating system of the computer 100 can direct the host device 102 to send the data 122 on each change in process-context or each thread-context switch. The data 122 may be associated with a first thread or a first CPU core of the processors 104 in an initial frame on the memory bus 110, and in a subsequent frame, the data 122 may originate from a different thread or a different CPU core of the processors 104. When the host device 102 includes a cache, the thread or CPU core of the processors 104 that triggers a write-back might not be the same thread or CPU core of the processors 104 that last accessed the data. In contrast, memory-reads are triggered by a most-recent read operation, prior to the transmission of the data 122. The ability to convey a thread or process identifier enables a simulator or other program to indicate through their respective outputs, requests from different threads being executed in parallel, without the simulator or other program needing to keep track of dependencies.

Including byte-loads and byte-stores (e.g., non-cacheable, input-output) issued by the program 116 can direct the processors 104 of the host device 102 to send the data 122 via the memory controller 106 to the memory 108 at a precise time or within a particular frame. Memory fencing techniques may be used to accurately position the data 122 within a memory trace, relative to other memory accesses recorded in the memory trace. Operations issued within a memory fence are certain to be executed by the processors 104 and the memory controller 106 prior to operations issued outside the memory fence. The program 116 may include or be any instrumentation, software library, or other type of module configured to inject metadata in the address stream 112 as the data 122. Alternatively, hardware circuitry of the host device 102 may inject the data 122 into the address stream 112.

In operation, the program 116 may inject a thread identifier into the address stream 112 on the memory bus 110, which appears in the address trace being probed, whenever the program 116 switches to a new thread. The memory 108, other program, or trace analyzer that receives the thread identifier determines which thread executing on the processors 104 of the host device 102 is producing the addresses for memory operations that follow. The thread identifier, along with other types of data 122, are examples of context, which provides a richer trace because individual sections of the trace can be associated with different threads. This thread identifier or other data 122 may appear on the memory bus 110 before, after, or as part of a payload message, which is described with reference to FIGS. 2-1 and 2-2.

Mailbox Communication and Messaging Protocol

Figures 1, 2:
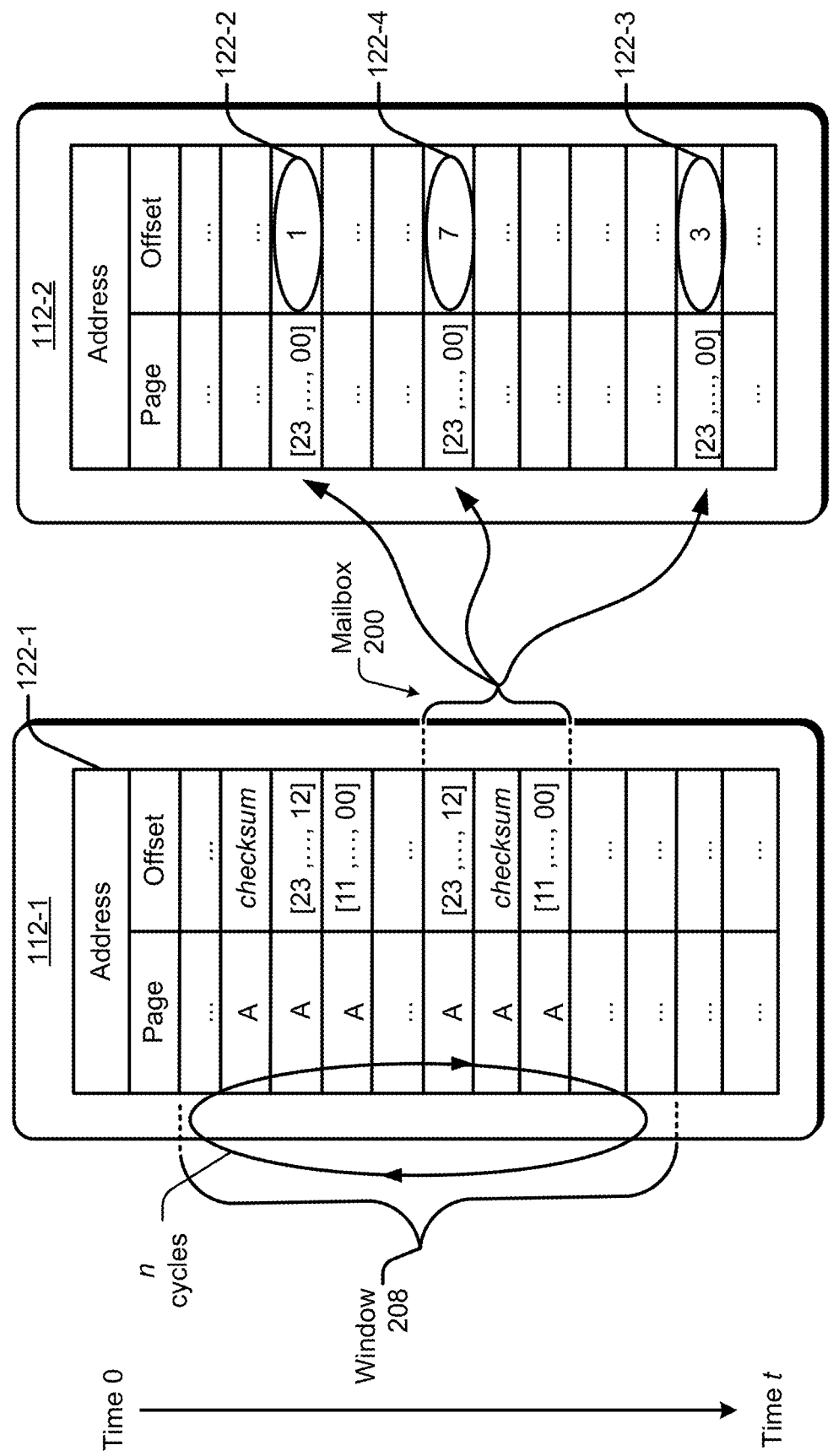
Figure 2:
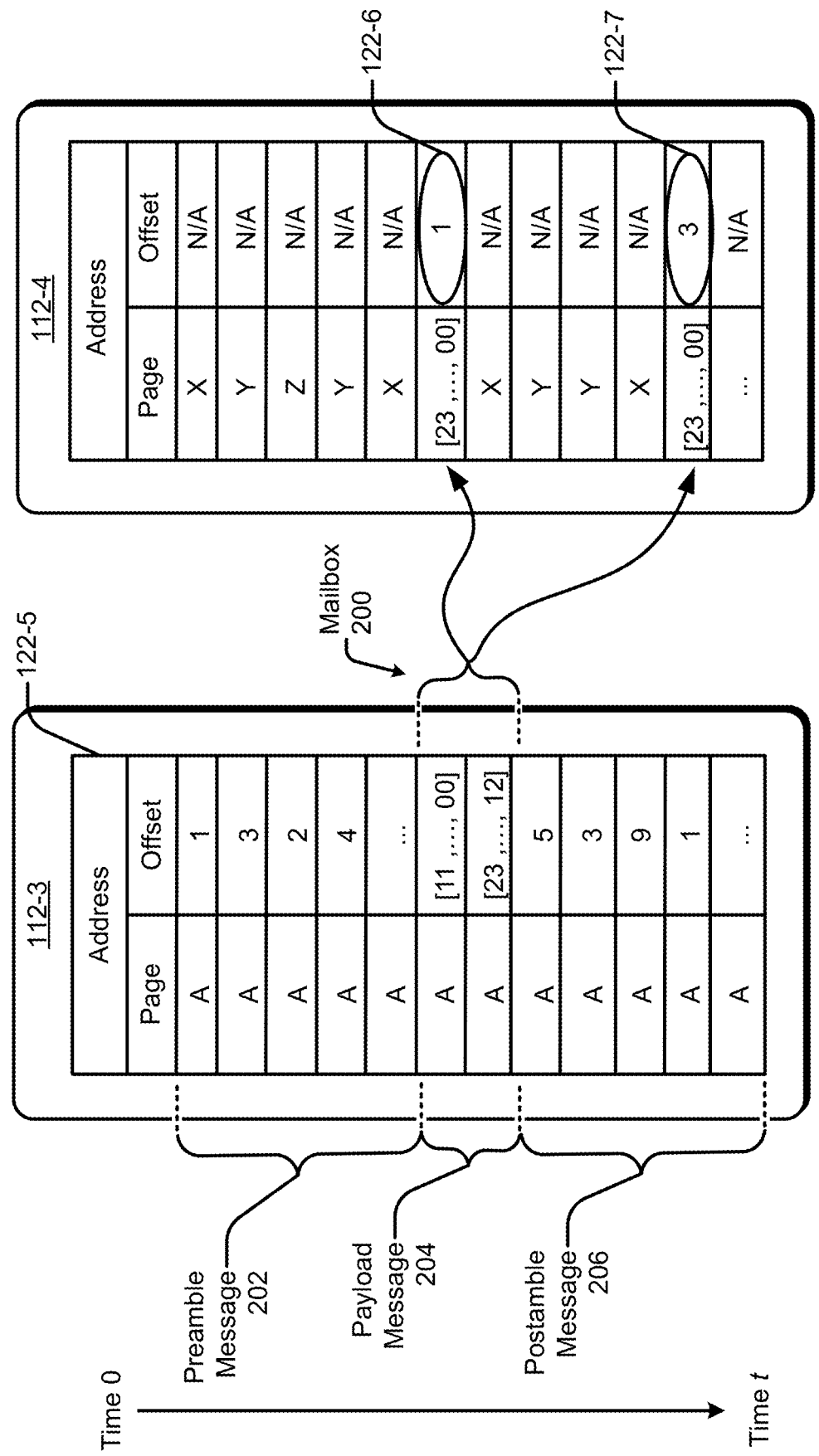

FIGS. 2-1 and 2-2 illustrate aspects of communication within an address stream, in which a mailbox is referenced by data in the address stream. FIG. 2-1 illustrates mailbox communication, which involves the communicating program allocating memory for the mailbox upfront using repeated transmissions. FIG. 2-2 illustrates a messaging protocol, which utilizes preamble, payload, and/or postamble messages to convey data from one end of the address stream to the other. In the examples of FIGS. 2-1 and 2-2, time elapses in the downward direction from time 0 to time t.

By default, the memory 108 (of FIG. 1) treats bits of information in the address stream 112-1 as addresses 118 for a memory request. The processors 104 and the memory controller 106 of the host device 102 are configured to communicate addresses 118 in the address stream 112-1 shared with the memory 108. The memory 108 uses the addresses to read, write, or otherwise execute a memory operation with the memory 108.

In some implementations, the address stream 112-1 can adhere to a split-transaction protocol. The split-transaction protocol allows the memory controller 106 and the memory 108 to execute groups of load and store instructions in a non-atomic way, without the program 116 or the processors 104 having to manage their execution. Operating a memory with a split-transaction protocol can facilitate efficient memory accesses.

Turning first to FIG. 2-1, which illustrates an example mailbox 200 that is established in a portion of the memory 108 allocated in advance, before the program 116 embeds data 122-2, 122-3, or 122-4 in an address stream 112-2. The address streams 112-1 and 112-2 are examples of the address stream 112. The program 116 causes the computer 100 to allocate the mailbox 200 as a contiguous amount of storage at the memory 108. The mailbox 200 may be equal to a size of a page in memory, or multiple pages of memory to increase a size of the offset and thereby increase bandwidth or improve checksum performance. To establish the mailbox 200, the program 116 causes the host device 102 to send a repeating pattern (n cycles) of addresses in the address stream 112-1 within a window 208. The window 208 may be established as having a particular length of time (e.g., a time window) or having a particular quantity of address entries of the address stream 112-1. One address in each repeating pattern can represent a checksum for determining an order to the remaining (two in this example) addresses in the repeating pattern. The remaining addresses, when concatenated together in a particular order that satisfies the checksum, define the page or range of pages for the mailbox 200. Although the addresses for the two depicted cycles are illustrated as being temporally adjacent, the addresses may alternatively be separated by other addresses, including those with addresses for memory requests or those with data that are masquerading as addresses for memory requests.

In response to detecting n repetitions of two or more address entries with a corresponding checksum, within an allowed window 208 of addresses, and with little or no interspersed or spurious other addresses, the memory 108, a logic analyzer, or other recipient that detects the repeating pattern in the address stream 112-1 determines that mailbox 200 is dedicated to the program 116 for the duration of the program 116. This allows the program 116 to establish a private mailbox for application-specific data. This can be simpler than using a preamble, payload, and/or postamble message, which is described in FIG. 2-2, because a preamble or postamble recognition scheme can be avoided while still handling the address re-ordering by the host device 102 that can make a mailbox hard to decode.

As shown in FIG. 2-1, the recipient of the address stream 112-2 can interpret data 122-2, 122-3, and 122-4 based on subsequent memory requests that reference the mailbox 200. Because the mailbox 200 is contained within a privately allocated portion of the memory 108, which is owned by the program 116, there is not likely to be interfering, or unintended addressing to the mailbox 200 within the range of addresses allocated to the mailbox 200.

As an alternative to establishing the mailbox 200 with repeated transmissions, FIG. 2-2 shows how a messaging protocol can be used to indicate the location of the mailbox 200. In processing the address stream 112-3, which along with address stream 112-4 are examples of the address stream 112, a recipient can determine the mailbox 200 from having identified a preamble message 202, a postamble message 206, and/or a payload message 204 in-between. The address stream 112-3 propagates or carries data 122-5, which is an example of the data 122. The address stream 112-3 provides the mailbox 200, and the address stream 112-4, which occurs subsequently, references the mailbox 200 to communicate additional data 122-6 and 122-7, as further examples of the data 122.

In operation, the memory 108 determines that a current portion of the address stream 112-3 includes an indication of the data 122-1 as opposed to addresses. Responsive to determining that the current portion of the address stream 112-3 includes addresses 118 and does not include data embedded therewith, the memory 108 executes reads or writes to fulfill memory requests with the addresses 118 contained in the current portion of the address stream 112-1.

In contrast, when the indication of the data 122-1 appears in the address stream 112-3, the memory 108 interprets the address stream 112-3 differently than if it were the addresses 118. Based on the data 122-5 appearing in the address stream 112-3, the memory 108-1 can determine a context of a memory request or a command to perform rather than determining an address page or offset associated with a memory request. Responsive to determining that the current portion of the address stream 112-3 includes the data 122-5, the memory 108 can ignore the data 122-5. Alternatively, the memory 108 can extract the data 122-5 from the current portion of the address stream 112-3 to perform a command or save the data 122-5 for outputting as part of a testing scenario, which is described with reference to FIG. 5. Although some of the description herein refers to the memory 108 or 108-1, as the device processing an address stream 112 or taking actions based on detected data 122 during operation or testing, these descriptions may also or instead apply to acts performed by a logic analyzer or test equipment that is processing the address stream (e.g., offline after a test has been concluded).

To convey the data 122-5 within the address stream 112-3, the processors 104, acting through the memory controller 106, communicate a payload message 204, and optionally, a preamble message 202 and/or a postamble message 206, in any order. If the preamble message 202 or the postamble messages 206 is output, the host device 102 outputs the preamble message 202 before communicating the payload message 204, which typically precedes the postamble message 206. The memory controller 106 can, however, reorder the messages 202, 204, 206 within the address stream 112-3 as part of a scheme to issue memory requests in an order that efficiently accesses different memories cards, banks, or modules. Thus, the memory bus 110 may convey to the memory 108 the payload message 204 before or after transmitting either of the optional preamble or postamble messages 202 and 206. The memory 108 can nonetheless identify the preamble message 202, the payload message 204, and the postamble message 206, no matter the order of appearance in the address stream 112-3. Responsive to identifying the preamble message 202, the memory 108 interprets the payload message 204 as containing or being at least part of the data 122-5. The memory 108 determines an end to the data 122-5 in response to identifying the postamble message 206.

The host device 102 indicates a beginning or head of the payload message 204 by outputting the preamble message 202. The preamble message 202 appears in the address stream 112-3 at time 0 and alerts the memory 108 to the start of the payload message 204.

To determine that the address stream 112-3 includes the payload message 204, the memory 108 may look for the preamble message 202. The preamble message 202 is a repeating sequence of addresses across multiple address strides. The host device 102 communicates (e.g., places or drives) the addresses of the preamble message 202 onto the memory bus 110 repeatedly (e.g., hundreds of times). The memory 108, or a logic analyzer of the computer 100 or automated test equipment (ATE) for memory simulation scenarios that are performed offline, identifies the preamble message 202 in response to recognizing the repeating sequence of addresses within some sliding window of addresses (not shown in FIG. 2-2). In some cases, the pattern of addresses in the preamble message 202 is derived from deltas between addresses, rather than absolute values of the addresses themselves. Also referred to as inter-address-deltas, each address-delta is a difference between two addresses. In summary, the data 122-5 is transferred within the address stream 112-3 as a predetermined pattern of addresses or inter-address-deltas that the memory 108, or the logic analyzer, is programmed to recognize. In some examples, the predetermined pattern is a statistical distribution of addresses, which are interpreted together as the preamble message 202.

In example operations, the memory 108 is configured to determine that the address stream 112-3 includes the preamble message 202 by identifying a pattern of offsets of addresses in the address stream. In FIG. 2-2, the pattern of offsets in the preamble message 202 includes the offsets [1, 3, 2, 4]. The memory 108 recognizes the preamble message 202 in response to identifying such a pattern of offsets in the address stream 112-3. Responsive to determining that the address stream 112-1 includes the preamble message 202, the memory 108 detects or determines the presence of the payload message 204.

To improve reliability in communicating the data 122-5 within the address stream 112-3, the pattern of offsets in the preamble message 202 may encode a pattern of deltas that indicate the preamble message 202. Each delta in the pattern of deltas is an inter-address difference or delta between pairs of the offsets in the address stream 112-3. In FIG. 2-2, the pattern of deltas in the preamble message 202 includes [+2, −1, +2]. The memory 108 may recognize the preamble message 202 in response to identifying the pattern of deltas.

During a subsequent communication of data 122-3 in the address stream 112-3, the memory 108 may identify the same pattern of deltas [+2, −1, +2] based on the same or a different pattern of offsets previously included in the preamble message 202. For example, the memory 108 can recognize the preamble message 202 in a subsequent portion of the address stream 112-3 that the pairs of offsets in the subsequent portion of the address stream 112-3 are the same or different than the pairs of offsets [1, 3, 2, 4] in a previous preamble message 202. If different from previous pairs of offsets, the pairs of offsets included in the preamble message 202 can again encode a pattern of deltas corresponding to [+2, −1, +2] to indicate the beginning of the payload message 204.

To compensate for an unknown reordering on the memory bus 110, which may be performed by the memory controller 106, the memory 108 may identify a particular ratio of offsets or deltas between pairs of offsets in the preamble message 202. For example, a pattern of deltas corresponding to [+2, +2, −1] may be deemed the same as the pattern of deltas including [+2, −1, +2] within a window of addresses of a given size. Likewise, rather than deltas, a particular ratio of offsets can be used to convey the preamble message 202. For example, the memory 108 may identify an equal quantity or distribution of offsets that correspond to 1, 3, 2, and 4.

The memory 108 may seek to identify hundreds of occurrences of the offsets to identify a single preamble message 202. For example, the computer 100 or operating system thereof has a four-kilobyte address range in each page of memory. The preamble message 202 includes absolute offsets (e.g., [1, 3, 2, 4]) within the page "A". The memory 108 may recognize the preamble message 202 in response to identifying the absolute offsets within the page "A" or an equal quantity of each of the absolute offsets within a time window of the address stream 112-3. The memory 108 seeks a high density of addresses on the memory bus 110 that pertain to same memory page. For instance, a relevant high density of addresses reference a single page "A," and each address has one of the absolute offsets found in the preamble message 202. In response to identifying a sufficient quantity of each of the absolute offsets to satisfy a pattern of the preamble message 202, the memory 108 determines that the data 122-5 is being communicated on the memory bus 110 in the address stream 112-3.

The memory 108 may not identify the preamble message 202 with one hundred percent certainty, but the memory 108 likely detects the preamble message 202 with near (e.g., ninety-nine percent) certainty. The memory 108 may maintain a list of every page addressed within the sliding time window mentioned above. The memory 108 identifies the preamble message 202 in response to identifying a page with a high-reference-rate and a majority of absolute offsets that match the pattern of the preamble message 202.

Before time t, and after communicating the payload message 204 within the address stream 112-3, the processors 104 cause the memory controller 106 to communicate the postamble message 206 on the memory bus 110 as part of the address stream 112-3. The processors 104 output the postamble message 206 to indicate an ending of the payload message 204 and an end to the communication of the data 122-3 for this incidence.

The host device 102 communicates the postamble message 206 in the address stream 112-3 similarly to how the host device 102 causes the memory controller 106 to communicate the preamble message 202. For example, the processors 104 cause the memory controller 106 to output the postamble message 206 as a series of consecutive addresses to a common page in the memory 108, which series includes a particular pattern of absolute offsets or deltas in the address stream 112-3. Responsive to determining that the address stream 112-3 includes the postamble message 206, the memory 108 determines an end to the communication of the data 122-5.

In response to determining the postamble message 206, the memory 108 determines the data 122-5 based on a content of offsets that define the payload message 204, which appear before the postamble message 206 in the address stream 112-3. Between time zero and time t, the address stream 112-3 includes a time-ordered sequence of addresses within a single page "A" within the memory 108. The addresses of the data 122-5 may be transmitted by the host device 102 in the order received by the memory controller 106 from the processors 104. Alternatively, the memory controller 106 may reorder addresses of the address stream 112-3 or scramble addresses transmitted on the memory bus 110 at this time after, for example, what may be relatively long periods where the addresses appear in order. The memory 108 can account for the reordering of addresses that make up data when interpreting the addresses based on a sequence indication, a checksum, and so forth.

The memory 108 determines that the address stream 112-3 includes the postamble message 206 by identifying a corresponding pattern of offsets. In FIG. 2-2, the pattern of offsets in the postamble message 206 includes [5, 3, 9, 1]. The memory 108 is configured to recognize the postamble message 206 in response to identifying this pattern of offsets. As discussed above in relation to the pattern of offsets in the preamble message 202, the pattern of offsets in the postamble message 206 may also encode a pattern of deltas. Each delta in the pattern of deltas is a difference between pairs of the offsets within the postamble message 206. To improve reliability in communicating the data 122-5 within the address stream 112-3, the memory 108 may recognize the postamble message 206 in response to identifying multiple addresses as including another pattern of deltas in the address stream 112-3. For example, in FIG. 2-2, the other pattern of deltas in the postamble message 206 includes [−2, +6, −8].

In some cases, the payload message 204 of the data 122-5 includes a portion of the address stream 112-3 received after the preamble message 202 and before the postamble message 206. The payload message 204 encodes the data 122-5 within address bits that make up page offsets of addresses to a page "A" in the memory 108, which is the same page "A" in the addresses of the preamble and postamble messages 202 and 206. The data 122-5 may therefore correspond to at least the actual bit-content of the offset portion(s) of the payload message 204. In some examples, the data 122-5 includes a mailbox 200 that indicates a location that can be referenced when future data 122 is communicated, which is described with reference to the address stream 112-4.

Within the payload message 204, the host device 102 may communicate a mailbox location, which can include a page in the memory 108 that is referenced to efficiently communicate future data 122. For example, the mailbox 200 can correspond to a page address of the memory 108 that is referenced to communicate data 122-6 and 122-7. Thus, the mailbox 200 can also serve to indicate additional data, such as the data 122-6 or 122-7, to the memory 108 or a trace analyzer. The host device 102 communicates the mailbox location as address bits transmitted within the payload message 204. In this way, the payload message 204 can include actual, data 122-1 and/or a reference to a location of future data 122-6 or 122-7 to be communicated to the memory 108.

Based on the parts of the address stream 112-4 received after the preamble message 202, the memory 108 identifies a mailbox location of the mailbox 200. Based on the payload message 204, the memory 108 interprets the offsets as a mailbox location indicating a page of memory 108 that identifies when data 122-6 and 122-7 is being communicated. The offset bits numbered [11, . . . 0] and [23, . . . , 12] that appear in the payload message 204 are interpreted as a reference to establish the mailbox 200, rather than as an addressable offset for a memory request. In the example of FIG. 2-2, the memory 108 determines the data 122-6 and 122-7 to include "1" and "3," respectively, in the address stream 112-4.

Between time zero and time t, the address stream 112-3 includes a time-ordered sequence of addresses within a single page "A" that are sent to the memory 108. For ease of description, the addresses of the data 122-5 are transmitted by the memory controller 106 in the address stream 112-3 in the order received from the processors 104. As described in relation to the other drawings, the address stream 112-3 may include reordered or scrambled addresses during transmission on the memory bus 110 after what may be long periods where the addresses appear in order. As described below, the memory 108 can account for the reordering of addresses that make up data when interpreting the addresses using, for instance, an order-dependent checksum.

While the data 122-5 may appear as regular addresses including page and offset values, the page and offset values of the data 122-5 convey a message for the memory 108. A preamble message 202 appears initially on the memory bus 110 at time zero. The preamble message 202 precedes a payload message 204. The preamble message 202 and the payload message 204 are followed by a postamble message 206, which completes its transmission on the memory bus at time t. The moment that the preamble message 202 ceases, the memory 108 or logic analyzer may interpret addresses on the memory bus 110 as payload information. In the example of FIG. 2-2, the payload message 204 takes two memory cycles.

Rather than merely sending the data 122-5 as the payload message 204, the host device 102 can send the payload message 204 to initialize the mailbox 200 to establish how future data 122-6 and 122-7 will be indicated. The addresses in the payload message 204 encode data or a pointer to data for the mailbox 200. In the example of FIG. 2-2, the payload message 204 includes two address portions numbered [11, . . . , 0] and [23, . . . , 12]. When combined (e.g., concatenated), the two portions establish a memory page for the mailbox 200. If the memory page corresponds to page "P" of the memory 108, the data 122-6 and 122-7 are communicated within address offset bits of the page "P" mailbox 200. The data bits directed to the mailbox 200 may be ignored in terms of standard memory requests. On the host side, the processors 104 allocate the page "P" of the memory 108 to the program 116 for exclusive use by the program 116 to communicate the data 122-6 and 122-7, and potentially additional data. After initializing the mailbox 200, a subsequent address along the address stream 122 to the page "P" is a reference to a location of the memory 108 that is indicative that data is being communicated and may be interpreted or stored accordingly.

Figure 3:
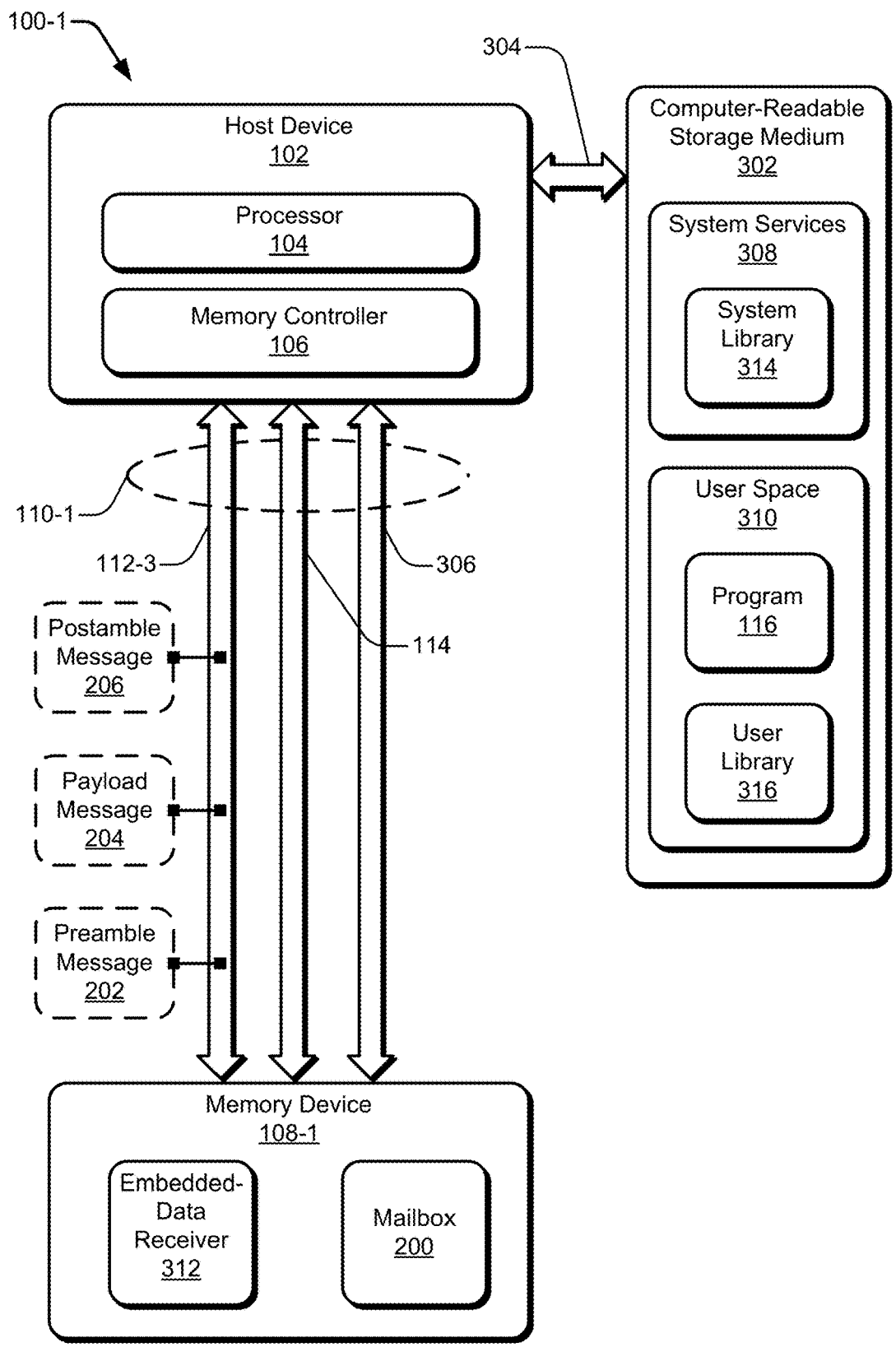
FIG. 3 illustrates another example computer configured to send data embedded in an address stream.

FIG. 3 illustrates an example computer 100-1 configured to send data embedded in an address stream. The computer 100-1 is only one example of the computer 100, and it is shown in greater detail. The computer 100-1 includes a computer-readable storage medium 302, which may be a non-transitory computer-readable storage medium. The host device 102 exchanges information with the computer-readable storage medium 302 over an interconnect 304. The computer-readable storage medium 302 may be realized at least partially using a memory device 108-1 and/or part of the host device 102, or the computer-readable storage medium 302 may be physically separate from the host device 102.

The computer-readable storage medium 302 includes multiple groups of data: one group is labeled user space 310, and the other group is labeled system services 308. The system services 308 provide applications that are accessible from the user space 310 including access to a variety of services and functions, such as a system library module 314 (also referred to simply as "a system library 314"). For example, the program 116, which is shown in FIG. 3 as being maintained in the user space 310, can call on a system function or a system task from the system library 314 to perform an operation on behalf of the program 116. The user space 310 may include a user library 316. The user library 316 may be customizable by a user of the computer 100-1 and provides applications executing from within the user space 310 with access to additional services and functions than those provided by the system library 314. The user library 316 or the system library 314 may include functions that, when called, enable the program 116 to send embedded data within the address stream 112.

The computer 100-1 also includes the host device 102, including the one or more processors 104 and the at least one memory controller 106. A memory bus 110-1, which is an example of the memory bus 110, propagates the address stream 112-3 and the data stream 114 between the memory controller 106 of the host device 102 and the memory 108-1. The address stream 112-3 carries, for example, the preamble message 202, the payload message 204, and the postamble message 206 that are sent from the host device 102. The memory bus 110-1 also includes one or more control lines 306, which carry control signals back and forth between the host device 102 and the memory device 108-1.

The memory 108-1 is an example of the memory 108. Included in the memory 108-1 is an optional embedded-data receiver module 312. In practice, the memory device 108 may be used, which does not necessarily include any hardware or software modifications, such as the inclusion of the embedded-data receiver module 312.

The embedded-data receiver module 312 determines that the address stream 112-3 includes addresses or data. In response to identifying data by, for example, detecting the preamble message 202, the embedded-data receiver module 312 configures the memory 108-1 to act on the data rather than process the address stream 112-3 as if it contained the kind of address typically observed on the memory bus 110-1 during a read, write, or other memory request.

The embedded-data receiver module 312 configures the memory 108-1 to identify, based on the payload message 204, the mailbox 200 where a dedicated page in the memory 108-1 is reserved to designate data. For some types of data, multiple mailbox locations may be used to transmit different types of data from the host device 102 to the memory 108-1. In such cases, the embedded-data receiver module 312 can determine, based on the payload message 204, multiple portions of the data that are associated with different mailbox locations. Additionally or alternatively, the embedded-data receiver module 312 can determine how many bits are associated with a page address portion and how many bits are associated with an offset address portion. Based on this information, the embedded-data receiver module 312 can interpret different sizes of data appropriately or concatenate multiple portions of data together. Thus, the host device 102 and the memory 108-1 can exchange data of varying sizes or amounts.

The program 116 can call on a function maintained by the system library 314 or the user library 316 to enable the program 116 to send data embedded in the address stream 112-3. In response to the function call, the processors 104 execute the function to request that the memory controller 106 allocate a page of the memory 108-1 to the program 116 for maintaining the mailbox 200. The program 116 interfaces with the libraries 314 or 316 to communicate the data using one or more mailbox locations.

As part of an initialization, the libraries 314 and 316 cause the processors 104 to communicate the one or more mailbox locations within the payload message 204. For example, the offsets within the payload message 204 can point to a location of the mailbox 200, such as by providing an address of a memory page for the mailbox 200. The program 116 outputs additional data by reading or writing at different times to the page address of the mailbox location of the memory 108-1 that is allocated to the program 116. For example, the libraries 314 or 316 can cause the processors 104 to output other data as offsets to the mailbox page within a subsequent payload message appearing on the address stream 112-3.

As one example, the program 116 can communicate a thread identifier associated with the program 116 with reference to a location of the mailbox 200. The thread identifier can be relatively long and therefore span multiple address offsets or address deliveries via the mailbox to communicate the entire thread identifier. The program 116 can output an indication of the mailbox page via which the data is communicated in a function call to the system library 314. For example, the mailbox location may correspond to a 24-bit address of the page of the memory 108-1 allocated for the mailbox 200. The program 116 can also provide the data to the system library 314.

In response to the function call by the program 116, the system library 314 generates the preamble message 202. By directing the processors 104 to output the preamble message 202, the system library 314 alerts the embedded-data receiver module 312 of the memory 108-1 to monitor the address stream 112-3 for the payload message 204. The embedded-data receiver module 312 determines that the preamble message 202 includes a sequence or pattern of offsets inserted to indicate a transmission of data. For example, the preamble message 202 may include a particular distribution of offsets in a long sequence of addresses, which the embedded-data receiver module 312 is programmed to identify.

Based on the information received from the program 116 about the mailbox location via which the data is to be communicated, the system library 314 generates the payload message 204. The payload message 204 may include, with reference to the location of the mailbox 200, the thread identifier or other data to be communicated. The data can be inserted as the offsets in a series of addresses appearing in the address stream 112-3. The common page identifier in the series of addresses that are included in the payload message 204 indicate to the embedded-data receiver module 312 at the memory 108-1 that data is being communicated via the mailbox 200.

The embedded-data receiver module 312 obtains the data identified by the mailbox 200 and included in multiple addresses of the address stream 112-3 as the payload message 204. By concatenating multiple portions of the data together, the embedded-data receiver module 312 determines the thread identifier of the program 116. Other types of information, including other kinds of program-execution context data, may alternatively be communicated over the address stream 112-3 via the established mailbox 200. Although some of the description herein refers to the embedded-data receiver module 312 processing an address stream 112-3 or taking actions based on detected data during operation or testing, these descriptions may also or instead apply to acts performed by a logic analyzer or test equipment that is processing the address stream (e.g., offline after a test has been concluded).

Using the established mailbox 200 allows larger amounts of data to be efficiently shared over the address stream 112-3 because the preamble message 202 is not needed for each piece of information being communicated. Using a mailbox 200, however, is not required for communicating data over the address stream 112-3. Furthermore, using the messaging protocol is not required to transmit data or an indication of data, within the address stream 112-3. Rather, the mailbox 200 can be allocated to a page in memory by the host device 102, such than whenever a recipient of the address stream 112-3 (e.g., the memory 108-1) identifies the page where the mailbox 200 is allocated, the recipient decodes the address referencing the page to be an offset to data in the mailbox 200.

As described above, in some examples the payload message 204 contains data that is informative of current processing characteristics or dependencies or that instructs the memory 108-1 to perform some function. This informative data is provided as an offset address instead of providing a mailbox location as shown in the address streams of FIGS. 2-1 and 2-2. In other words, the offsets within the payload message 204 may represent individual portions of data. When concatenated together by the embedded-data receiver module 312, the individual portions enable the thread identifier or other context data of the program 116 to be determinable directly from a memory trace of the memory bus 110-1.

Checksum Usage for Detection of Data in Address Streams

Figure 4:
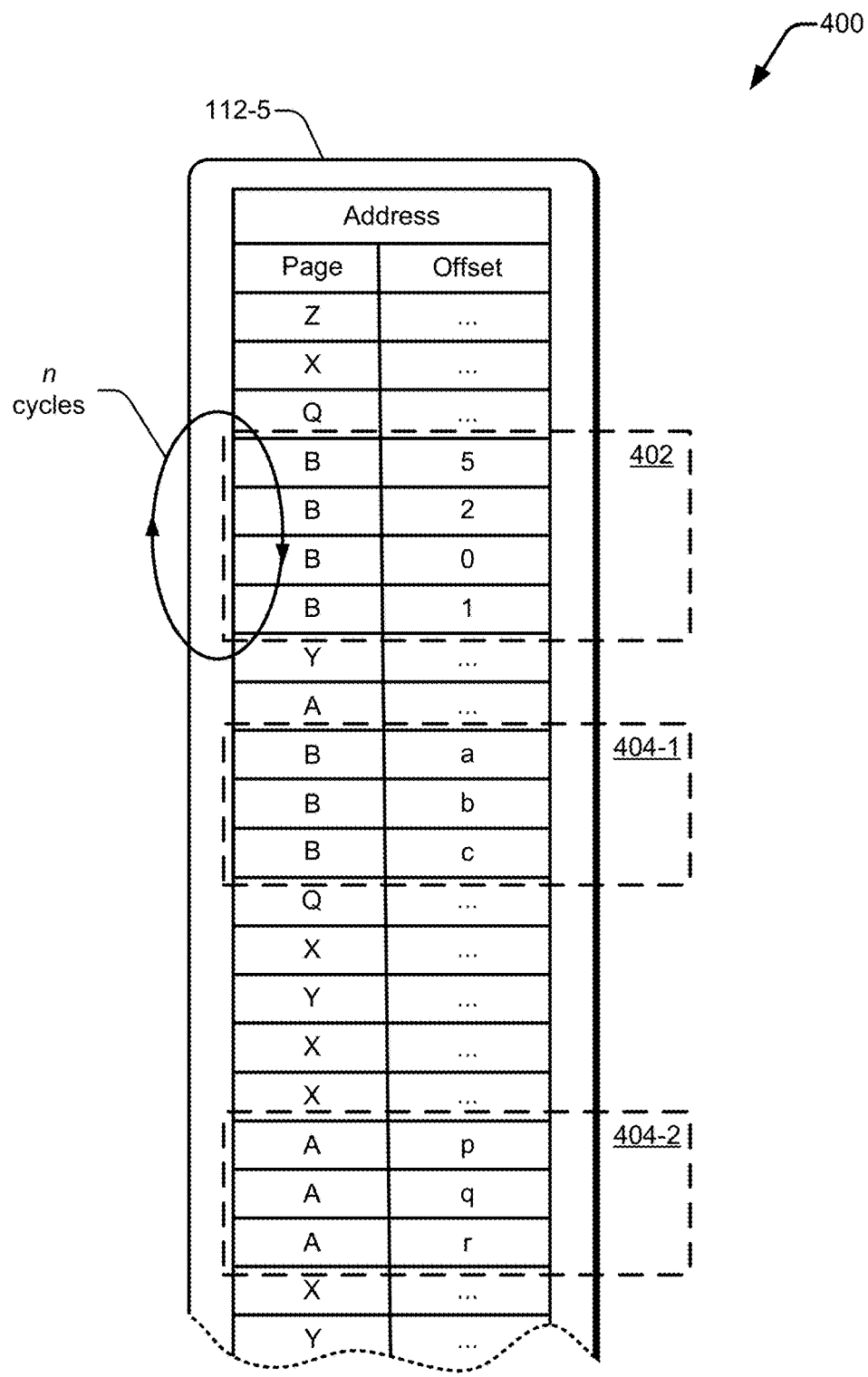
FIG. 4 illustrates an example address stream that enables identification of data using an error detection checksum.

FIG. 4 illustrates an example detection scheme 400 with an address stream 112-5 that supports detection of transmissions of data. When the program 116 or an operating system of the computer 100 wants to communicate embedded data via an address portion of the memory bus 110, a routine in the library 314 or 316 can direct the host device 102 to inject a preamble message 402 into the address stream 112-5. The preamble message 402, responsive to being identified by the embedded-data receiver module 312 of the memory 108-1, can presage transmissions of additional data using the messaging protocol described herein. This messaging protocol, which uses a checksum with each transmission of data, can obviate the use of a preamble message 402 for each such transmission.

The preamble message 402 in the address stream 112-5 includes a sequence of four addresses to page "B" with offsets [5, 2, 0, 1]. The indication of the presence of data by the preamble message 402 can be based on absolute offsets [5, 2, 0, 1] or on a series of inter-address deltas [−3, −2, +1]. The preamble message 402 can be repeated in the address stream for n cycles, with n being any positive integer. Repeating the sequence of offsets tens, hundreds, or thousands of times improves the likelihood that the embedded-data receiver module 312 will identify the preamble message 402. Accurate identification can prevent erroneous positive or negative detection of data (e.g., erroneous positive detection of data can occur when the processors 104 are in-fact communicating physical addresses for a memory request).

In controlling the memory bus 110, the memory controller 106 can rearrange the order in which the addresses appear in the address stream 112-5. Thus, the order of the offsets or inter-address deltas may be flexible in accordance with some described implementations.

Instead of identifying a particular sequence of offsets, the embedded-data receiver module 312 can identify the preamble message 402 by identifying a particular distribution of offsets to a single page in a sliding window of time or a given quantity of addresses. For instance, the embedded-data receiver module 312 identifies the preamble message 402 in response to noticing hundreds of addresses to the page "B" with the offsets "5," "2," . . . , and so forth. For each of the different absolute offsets or inter-address deltas observed in the address stream 112-5 during the sliding window of time, the embedded-data receiver module 312 keeps a count.

In response to determining that the counts of each of the different absolute offsets or inter-address deltas are equal during the sliding time window, the embedded-data receiver module 312 records the page "B" referenced in the preamble message 402 as the mailbox 200 (of FIG. 2). The module also begins to monitor for a payload message 404, which references the same page address "B" indicated in the preamble message 402. On the other hand, responsive to determining that the distribution of offsets does not match an expected distribution of offsets of a preamble message 402, the embedded-data receiver module 312 ignores the addresses in the address stream 112-3 because the addresses do not include embedded data.

Sending the preamble message 402 to start communicating data in this way can improve reliability and reduce noise in the address stream 112-5. This can be helpful because the other contents of the address stream 112-5 might interrupt a sequence of related addresses used for communicating embedded data. For the embedded-data receiver module 312, any noise within the address stream 112-5 corresponds to addresses for legitimate memory requests, as opposed to a transmission of data. The addresses that convey data are identified, and possibly recorded or otherwise used, by the embedded-data-receiver module 312, while the addresses for memory requests are not. In some cases, in response to determining the mailbox is, or corresponds to, page "B," the embedded-data receiver module 312 recognizes that this means the entire page "B" is exclusive to the program 116 for communicating data. There will likely be little-to-no noise in the mailbox page, so any addresses that are directed to the page "B" are determined by the embedded-data receiver module 312 to be transmissions of data.

Having identified the page "B" of the memory 108-1 as the mailbox 200 that the computer 100-1 allocated to the program 116, the embedded-data receiver module 312 determines that any additional addresses in the address stream 112-3 reference the page "B." Once the mailbox page "B" is established, the library 314 or 316 directs the host device 102 to output a payload message 404-1, including offsets [a, b, c]. The program 116, acting through the library 314 or 316, can therefore encode packets of data as offsets within the mailbox page "B."

The address stream 112-5 can transmit a payload message of any size, and the embedded-data receiver module 312, likewise, can receive and interpret a payload message no matter the size. Initially, the library 314 or 316 receives a request from the program 116 to transmit data. Within the request, the program 116 can share the size of the data with the library 314 or 316. In other examples, the library 314 or 316 can determine a quantity of addresses required to output the data by determining how many bits the data occupies. Based on this quantity of bits or size of the request and the quantity of bits per offset, the library 314 or 316 determines a number of addresses that will be used in the address stream 112-5 to send all the data in a single payload message 404. For example, the library 314 or 316 determines a total quantity of bits required for the payload message 404-1 to include the data [a, b, c]. By dividing this total quantity of bits by the data capacity of each address (e.g., the offset size in bits), the library 314 or 316 identifies a quantity of addresses for sending the data [a, b, c] as the single payload message 404-1.

To enable the decoding or detecting of data when received by the embedded-data receiver module 312 as part of the address stream 112-5, the library 314 or 316 can provide a checksum with transmissions of the data. A checksum provides a value that is derived from core data and can therefore link the core data to the checksum, and vice versa. An example of a checksum is a cyclic redundancy check (CRC) code. The library 314 or 316 can implement a CRC code scheme by sending a CRC checksum (also sometimes referred to as a "CRC value" or more simply as a "CRC") for the data, which can be part of the payload message 404-1. For example, only two offsets [a, b] of the three offsets in the payload message 404-1 include the data, while the third offset [c] is the CRC checksum for a particular combination of the two other offsets in the data.

The library 314 or 316 calculates a quantity of addresses to send the data, and then calculates the CRC checksum over the offsets within those addresses. Including the CRC checksum as an offset within an additional address enables the embedded-data receiver module 312 to detect which addresses make up the payload message 404-1. In addition, the CRC checksum enables the embedded-data receiver module 312 to identify the CRC and piece the payload message 404-1 together in a correct order, even if the memory controller 106 rearranges the pieces of the payload message 404-1 and issues them over the memory bus 110 in a different order or as an unordered group.

In the illustrated example, over a sliding window of time, the address stream 112-5 includes the payload message 404-1. The payload message 404-1 is directed to the mailbox page "B" and includes three addresses with the offsets [a, b, c]. Although three offsets appear in the address stream 112-5, only two of the offsets are payload data, and the third is the CRC checksum. The embedded-data receiver module 312 may be unaware of which of the three offsets is the CRC checksum and a correct order of the payload data.

To determine which offset is the CRC checksum, the embedded-data receiver module 312 considers all the offsets in the payload message 404-1, which is identified by the address page "B," combined (e.g., concatenated) in different permutations until a combination of all but one offset equals the CRC checksum of the remaining offset. For the offsets [a, b, c], the different combinations of offsets include abc, acb, bac, bca, cab, and cba. With a high probability, only one of the different combinations will pass a CRC check. For instance, "a+b" may produce a checksum "c." The embedded-data receiver module 312 determines the combination that correctly specifies a CRC checksum computed for the other offsets received during the sliding window. The CRC check will fail if bits are in a different position from which the bits were encoded and output to the address stream 112-5. By considering each of the different combinations until the correct sequence of two address offsets results in a checksum indicated by the third offset, the embedded-data receiver module 312 can decode the data from the address stream 112-5 using the CRC checksum. Although a CRC checksum is used by way of example, other checksums that verify data payload, with or without order confirmation, can be used instead.

When the embedded-data receiver module 312 determines a combination of offsets that reference the mailbox page "B" and that pass the CRC checksum, the embedded-data receiver module 312 can isolate the offsets for the data and discard the offset containing the CRC checksum. The isolated offsets can then be saved or used to perform some function. If the embedded-data receiver module 312 fails to identify the CRC checksum in an identified payload message 404, the embedded-data receiver module 312 may output an alert or notification that the CRC checksum failed. For example, the embedded-data receiver module 312 can inject a failure code in a trace of the memory bus 110 in response to determining that no combination of offsets within a payload message 404-2 produce a CRC checksum that is included in the message identified by a different page address "A."

Although not shown in FIG. 4 with a preamble message, the embedded-data receiver module 312 may have determined that the page address "A" of the memory 108-1 corresponds to the mailbox 200. In trying to determine the CRC checksum for the payload message 404-2, the embedded-data receiver module 312 may fail to identify a combination of offsets [p, q, r] from the payload message 404-2 that satisfy the CRC checksum included in one of the other offsets. During subsequent analysis of the trace, the failure code that appears on the address stream 112-3 indicates where the CRC checksum failed, to aid in debugging the failure.

An advantage of this checksum technique is that it does not matter in which order the individual addresses to a mailbox appear because (except in very rare circumstances) the CRC check will only pass with a single correct combination. When computing or applying a CRC checksum, the order matters. If the offsets are analyzed in a different order from the one used to produce the CRC checksum, the CRC checksum will not be validated. The CRC checksum entails a specific order to the bits corresponding to the CRC, so if the ones and zeroes are in a different order, the CRC check fails.

The CRC can be computed or established by the library 314 or 316; however, attributes of the CRC checksum or a scheme implementing CRC do not need to be established up-front. The CRC can be any size, and the library 314 or 316 may communicate the size of the CRC checksum within the offsets of the preamble message 402 or a previous payload message 204 (e.g., of FIG. 2). These types of initializations can set up or communicates the size or type of the checksum that is to be used. Although it can be changed at runtime (e.g., through another preamble message), if the embedded-data receiver module 312 knows the number of bits for a CRC checksum before calculating the different combinations of offsets, the search for the correct combination of offsets can consume fewer processing resources or be completed more quickly.

The library 314 or 316 can additionally or alternatively communicate how many addresses form a group that includes both a checksum and the associated payload data to facilitate analysis at a memory device. In some of the example implementations described above, the checksum approach to detecting data is performed in conjunction with a mailbox page. For instance, the payload message 404-1 is depicted as using the page "B" as a mailbox. These implementations facilitate identifying those addresses that should be analyzed for potentially matching a checksum. However, these implementations also entail sending a preamble message 402, which can be relatively lengthy. Thus, in other example implementations, the payload message 404-1 can be sent without first establishing a mailbox. These implementations that omit a mailbox avoid the overhead of the preamble message 402 with an added cost for decoding the address stream 112-5 and detecting a set of related addresses using a checksum. Further, although some of the description herein refers to the embedded-data receiver module 312 processing an address stream 112-5 or taking actions based on detected data during operation or testing, these descriptions may also or instead apply to acts performed by a logic analyzer or test equipment that is processing the address stream (e.g., offline after a test has been concluded).

Testing Environment

Figures 1, 5:
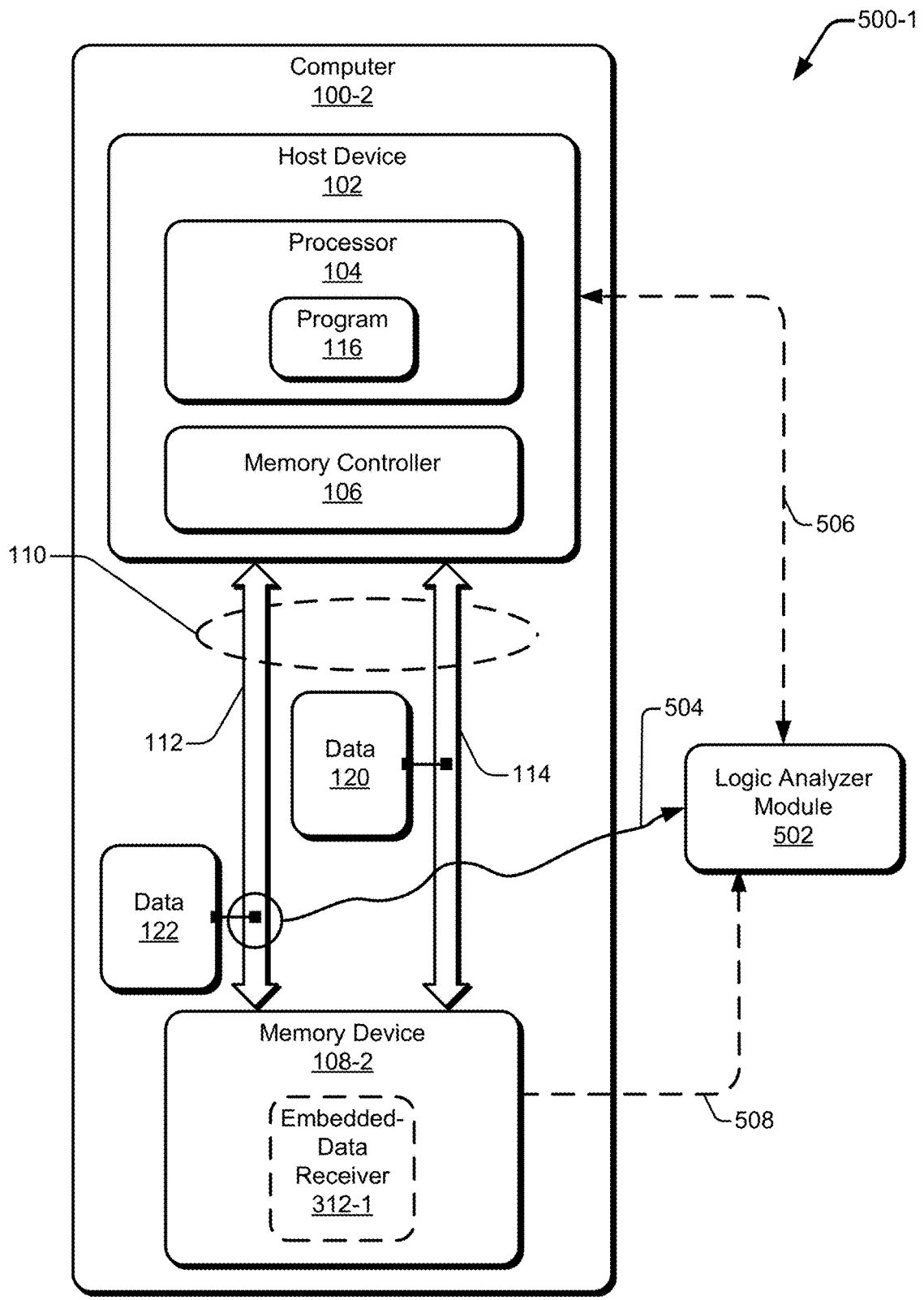
Figures 2, 5:
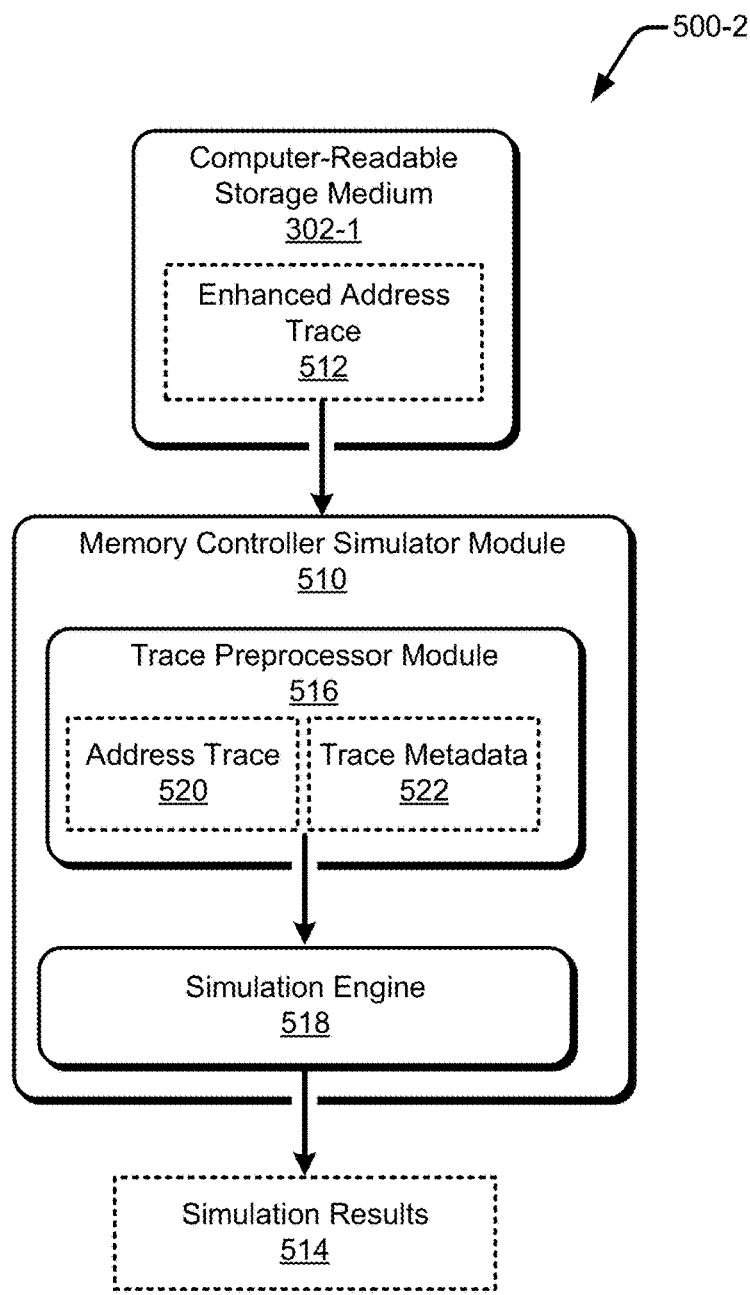

FIG. 5-1 illustrates additional an example environment 500-1 in which various techniques and devices described in this document can operate to perform a memory test. The environment 500-1 includes a computer 100 2, which is an example of the computer 100-1. The computer 100-2 includes the host device 102 communicatively coupled with a memory device 108-2, which is an example of the memory device 108-1. The computer 100-2 is also communicatively coupled to a logic analyzer module 502, for example, via one or more probes 504 directly-coupled to the memory bus 110, via an interconnect 506 connected to the host device 102, or using an interconnect 508 coupled to the memory device 108-2. The logic analyzer module 502 may be an internal component of the computer 100-2 or even the memory 108-2 within the computer 100-2. In other examples, the logic analyzer module 502 is implemented external to the computer 100-2, such as part of ATE, and configured to record a trace of the memory bus 110.

The logic analyzer module 502 determines the data 122 embedded within the address stream 112, directly from the address stream 112 or indirectly. The data 122 is directly determined from signals obtained via the one or more probes 504. To indirectly determine the data 122, other signals or information is used, specifically information or signals obtained from the host device 102 or the memory 108-2 over the interconnects 506 or 508. For example, an optional embedded-data-receiver module 312-1, which is an example of the embedded-data-receiver module 312, may determine the data 122 embedded within the address stream 112 and output the data 122. Either by directly or indirectly determining the data 122 embedded in the address stream 112, the logic analyzer module 502 uses the data 122 to tag or otherwise enhance a memory trace generated from other information appearing on the memory bus 110.

No matter the source of input signals, the logic analyzer module 502 can compile the signals received from the one or more probes 504, the interconnect 506, and the interconnect 508 into an enhanced memory trace that can be analyzed concurrently with traffic that appears on the memory bus 110, or offline. The logic analyzer module 502 may output the enhanced memory trace to a data file, the program 116, or another system for consideration by a test and evaluation group, for example, using the interconnect 506. This output from the logic analyzer module 502 may drive a user interface of the program 116 or a different application from which a user of the computer 100-2 can analyze operations associated with the host-device-to-memory-device interface, including the memory bus 110 of the computer 100-2.

The embedded-data receiver module 312-1 may output different information to the logic analyzer module 502 than the information the embedded-data receiver module 312-1 collects from the address stream 112. For example, the data 122, including a CRC checksum, may appear on the memory bus 110 as part of the address stream 112. In response to determining the CRC checksum and verifying the accuracy of the data 122, the embedded-data receiver module 312-1 may output a version of the data 122—via the interconnect 508, except for excluding the CRC checksum from the data 122, originally. In some cases, the embedded-data receiver module 312-1 uses the data 122 without passing it on to the logic analyzer module 502. In this way, the communication of the data 122 can be transparent to the logic analyzer module 502.

Simulation Environment

Turning to FIG. 5-2, illustrated is an example environment 500-2 in which various techniques and devices described in this document can operate to simulate a memory using results generated from a memory test. The environment 500-2 represents part of a simulator computing system and includes a memory controller simulator module 510, which when executed on a processor (not shown) configures the processor to output simulation results 514 based on an enhanced address trace 512, which includes data embedded in an address stream.

The memory controller simulator module 510 is communicatively coupled with a computer-readable storage medium 302-1, which is an example of the computer-readable storage medium 302. The logic analyzer module 502, for example, stores the enhanced address trace 512 based on information collected from at least one of the probes 504, the interconnect 506, or the interconnect 508. The computer-readable storage medium 302-1 may further store simulation results, control dependencies, or other address trace data or metadata.

The memory controller simulator module 510 includes a trace preprocessor module 516 configured to receive the enhanced address trace 512 as input and separates the enhanced address trace 512 into two portions. A first portion includes an address trace 520, without any embedded data, and the second portion includes trace metadata 522, which represents the embedded data, including control dependencies or other context, separated from the enhanced address trace 512.

A simulation engine module 518 of the memory controller simulator module 510 produces the simulation results 514 output from the memory controller simulator module 510. The simulation results 514 associate data, including control dependencies or other context, with the addresses shown in the address trace 520. Because the simulation engine module 518 incorporates the trace metadata 522 into an analysis of the address trace 520, the simulation results 514 are more accurate, or at least more detailed than simulation results produced without embedding data in an address stream during a test. The memory controller simulator module 510 is configured to use the enhanced address trace 512, which includes embedded data, to produce a more-accurate simulation of a memory design than if the address trace 520 is used without access to the trace metadata 522 to generate simulation results.

Testing Operations

Figure 6:
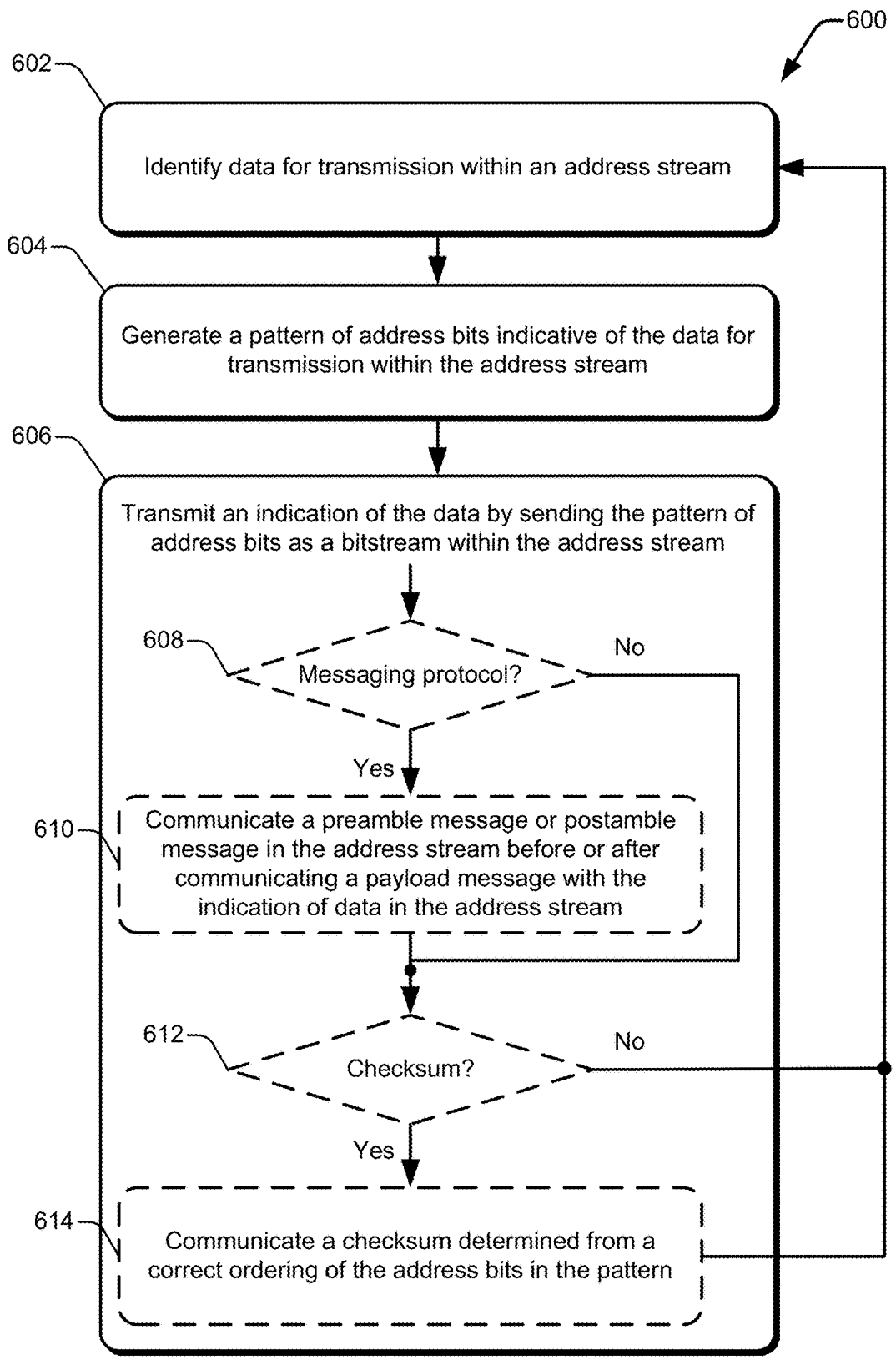
FIG. 6 illustrates example operations performed by a computing system configured to embed data in an address stream.

FIG. 6 illustrates an example process 600 with operations 602 through 614 performed by a computing system configured to embed data in an address stream, the address stream being separate from a data stream. As described throughout, the address stream and data stream are propagated over a single interconnect, such as a memory bus. For example, the computer 100 performs the operations 602 through 614 by executing instructions at a host device 102, such as instructions associated with the program 116 and/or a library, such as the library 314 or 316 from FIG. 3. Performance of the operations (or acts) 602 through 614 is not necessarily limited to the order or combinations in which the operations are shown in FIG. 6 or described herein. Further, any of one or more of the operations may be repeated, combined, or reorganized to provide other operations for embedding data in a data stream. In executing the operations 602 through 614, the computer 100 is therefore configured to communicate data 122 in an address stream 112 over a memory bus 110 extending between the host device 102 and a memory 108.

At 602, the computer 100 identifies data for transmission within an address stream. For example, the host device 102 receives data from the program 116, which while executing at the processors 104, calls on the library 314 or 316 to invoke one or more functions. When invoked by the program 116, the library 314 or 316 directs the host device 102 to send data 122 within the address stream 112.

At 604, the computer 100 generates a pattern of address bits indicative of the data for transmission within the address stream. For example, while executing at the host device 102, the library 314 packages the data 122 received as input from the program 116, into a format suitable for communication through the address stream 112. The pattern of address bits indicative of data may be formulated in accordance with the repetition-based pattern of FIG. 2-1, the message-based pattern of FIG. 2-2, and so forth. The pattern of address bits may include a checksum, a sequence indicator per address, and the like.

At 606, the computer 100 transmits an indication of the data by sending the pattern of address bits as a bitstream within the address stream. Here, the bitstream includes multiple bits and occupies a portion of the address stream 112 and includes data or an indication of data instead of address information. For instance, the packaged data 122 from step 604 is output by the memory controller 106 onto the address stream 112. An indication of the packaged data 122 appears on the address lines of the memory bus as an. The encoded series of one or more addresses, rather than conveying an address for a read or write request, informs the memory 108 or other recipient of the address stream 112 (e.g., the logic analyzer module 502) that data is being transferred from the host device 102 over the address stream 112.

At 606, the computer 100 can transmit the indication of the data in various ways, as described throughout this document. Each of the operations 608, 610, 612, and 614 are optional and not required but can promote reliability or security in sending data through an address stream.

At 608, the computer 100 determines whether to use a messaging protocol. If so, when a recipient of the address stream 112 is configured to detect a preamble message, a payload message, and/or postamble message, the computer 100 includes at 610 the data 122, or an indication of how the data 122 is referenced in relation the memory 108, as part of the payload message. For example, the address bits communicated through the address stream may represent the data 122, or they may indicate an offset to a page of the memory 108 which is reserved by the program 116 to communicate the data 122 over an address stream 112. In other implementations, the pattern of address bits may be repeatedly transmitted (e.g., in n cycles) within a window 208 of time to indicate that data is present in the address stream 112.

Alternatively, when the recipient of the address stream 112 is not configured for communicating using the messaging protocol described herein, the computer 100 may bypass operation 610 and proceed to operation 612. In such cases, the computer may include the data 122 as an encoded series of address bits, which are subsequently identifiable from a memory trace or by the recipient. Or, still bypassing step 610, the computer 100 can communicate an indication of the data 122 without relying on the described messaging protocol by transmitting address bits that indicate a page that is reserved for communicating the data 122 to the memory 108.

At 612, the computer 100 determines whether the communication of the data 122 is to include a checksum, such as a CRC checksum, in the event the memory bus 110 rearranges some of the address stream 112 so that parts of the data 122 appear out-of-order when communicated through the address stream 112. The checksum can be used by a recipient to determine a correct ordering of the address bits to determine the data 122 or mailbox location of the data 122. If the checksum is not being used, the computer 100 returns to operation 602 to repeat the process 600, if additional data is identified.

At 614, the computer communicates a checksum determined from a correct ordering of the address bits in the pattern. For example, a library routine of the host device 102, e.g., the library 314 or 316, determines a pattern of address bits or inter-address deltas for conveying the data 122, and determines a checksum based on the pattern so that if parts of the data 122 are interspersed with addresses, or otherwise rearranged in a different order than the host device 102 intended, the recipient can order the address bits to determine the data 122. Said differently, the host 102 may output the indication of data 122 as an unordered group of addresses that appear in the address stream 112. The processors 104 are configured to include, within the unordered group of addresses, one or more offsets that represent a checksum corresponding to remaining offsets from the unordered group of addresses arranged in a correct order.

A recipient of the address stream 112, may verify the data 122, such as a condition to outputting the data 122 on the interconnect 508 as part of a memory trace of the memory bus 110. Here, the embedded-data receiver module 312-1 or other recipient determines a plurality of offsets contained in the address stream 112. Based on the offsets, a particular offset in an ordered-combination of the plurality of offsets includes a checksum that is computed based on the remaining offsets in the ordered-combination.

For example, the payload message 404-1 includes the offsets [A, B, C] in any order. Two of the offsets, when concatenated together, satisfy the CRC checksum indicated by the third offset. To analyze these three offsets, the embedded-data receiver module 312-1 or other recipient can try each combination of the offsets [A, B, C] until a combination of two offsets produce a CRC checksum indicated by the third offset. In this example, the offsets "C" and "A," when concatenated together as "C+A," produce the CRC checksum value "B." The embedded-data receiver module 312-1 can isolate the offsets that represent the data 122 from the offset(s) that represent the CRC checksum. That is, responsive to determining a particular offset comprises a CRC checksum for the remaining offsets, the embedded-data receiver module 312-1 may identify the remaining offsets in the ordered-combination as being the data 122 communicated by the program 116 in the address stream 112. In other implementations, such as those that omit a checksum or that use a checksum that does not reflect data order, a sequence indicator may be included in the address stream as part of each offset having payload data in a group of related offsets.

The data 122 may indicate a mailbox 200 location corresponding to a page of memory allocated to a program that initiated the communication of the data. For example, the offsets A and B concatenate together forming mailbox location AB, which passes a CRC checksum equal to C. The program 116 can write additional data to the mailbox location AB in another payload message 404, without invoking the library 314 or 316 and/or without sending another preamble message 402. The embedded-data receiver module 312-1 or other recipient is programmed to recognize addresses in the address stream 112, including the page (e.g., page "B") where the mailbox is established.

Acts 606 through 614 may be repeated to, for example, enable the program 116 to output another payload message 404, or additional data, such as a new execution context indicator (e.g., a thread ID, a process ID, or a program counter (PC)).

Although some of the description herein refers to the embedded-data receiver module 312 processing an address stream 112 or taking actions based on detected data, these descriptions may also or instead apply to acts performed by a logic analyzer or other recipient device that monitors the address stream 112 (e.g., separately during or after a test has been concluded).

Simulation Operations

Figure 7:
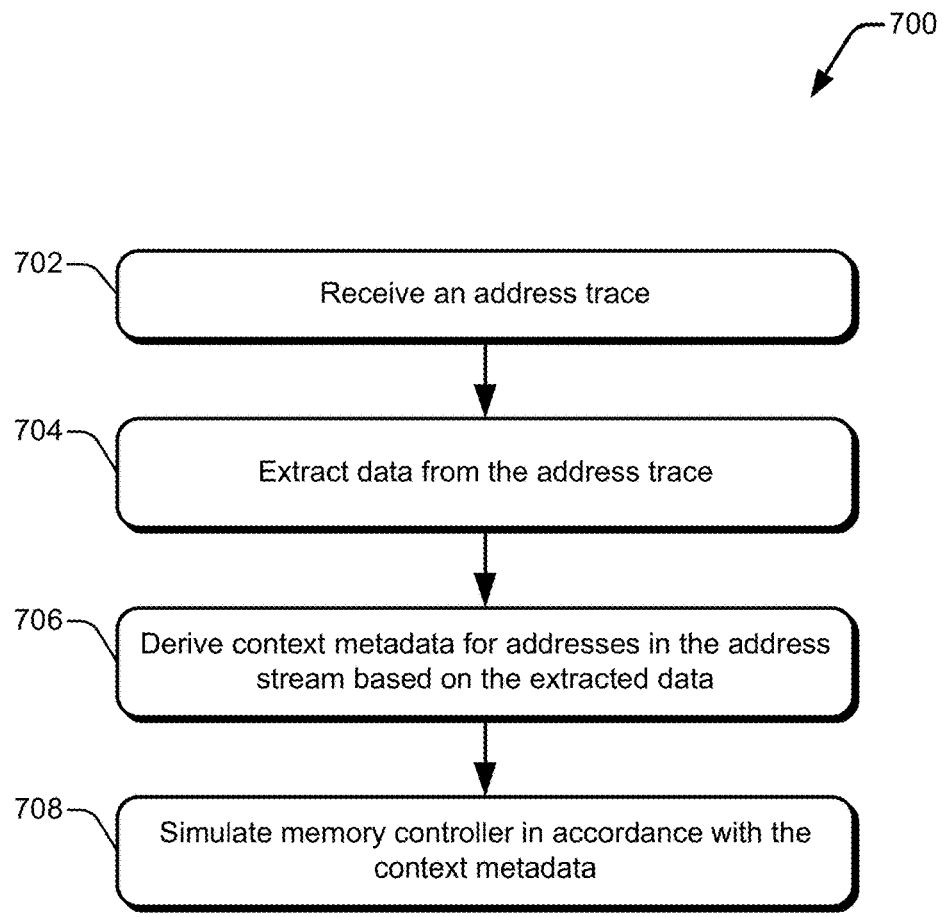
FIG. 7 illustrates example operations performed by a system configured to extract data embedded in an address stream.

FIG. 7 illustrates an example process 700 with operations 702 through 708 performed by a computing system configured to extract or interpret data embedded within an address stream that is propagated over a memory bus or other interconnect beings probed or monitored, e.g., during a memory test. For example, the memory controller simulator module 510 performs the operations 702 through 708 when instructions associated with the memory controller simulator module 510 are loaded by a processor. Performance of the operations (or acts) 702 through 708 is not necessarily limited to the order or combinations in which the operations are shown in FIG. 7 or described herein. Further, any of one or more of the operations may be repeated, combined, or reorganized to provide other operations for interpreting data embedded in an address stream.

At 702, the memory controller simulator module 510 receives an address trace. For example, the memory controller simulator module 510 obtains as input, the enhanced address trace 512, which is stored by the logic analyzer module 502, for example, within the computer-readable storage medium 302-1.

At 704, the memory controller simulator module 510 extracts data from the address trace. For example, the trace preprocessor module 516 receives the enhanced address trace 512 as input and divides the enhanced address trace 512 into the address trace 520, without any embedded data, and the trace metadata 522. The data can include a preamble message, a postamble message, a checksum, a payload message, and the like, as described throughout the disclosure.

At 706, the memory controller simulator module 510 derives context metadata for addresses in the address stream based on the extracted data. For example, the simulation engine module 518 derives control dependencies, thread identifiers, program counters, or other contextual information from the trace metadata 522 to use as inputs or variables for enhancing a simulation.

At 708, the memory controller simulator module 510 simulates a memory controller in accordance with the context metadata derived at 706. For example, the simulation engine module 518 uses the control dependencies, thread identifiers, program counters, or other contextual information derived from the trace metadata 522 to annotate or highlight portions of the address trace 520. This way the simulation results 514 that are output by the simulation engine module 518 are enhanced to include meaningful information about the context of addresses observed during the test.

While the techniques for embedding and extracting data from within an address stream are primarily described as promoting memory tests and memory simulations, there are many other use cases for embedding data within address streams. For example, the data can be used by the memory 108 or the host device 102 to align system or software events with their memory activity, for example, when analyzing memory behavior to debug software issues with execution of the program 116. The data may convey parameters or data, which when embedded in an address stream, direct internal functions or parameters of the memory 108, for example, by specifying values or states of memory-side hardware-registers that configure accelerators or other components of the memory 108.

The entities of FIGS. 1 through 5 may be further divided, combined, or used with their respective illustrated components as described herein. The example operating environments 100 of FIG. 1, 500-1 of FIGS. 5-1, and 500-2 of FIG. 5-2, as well as the detailed illustrations of FIGS. 2-1, 2-2, 3, and 4 illustrate but some of many possible environments, systems, and devices capable of employing the described techniques. Furthermore, some of the processes and methods described in this document are depicted in FIG. 6 or FIG. 7 as groups of blocks that specify operations performed, but the operations specified by the groups of blocks are not necessarily performed in the order or combination shown. Any of one or more of the operations may be repeated, combined, reorganized, or linked to provide a wide array of additional and/or alternate methods, including with other processes described herein. Also, the techniques are not limited to performance by one entity or multiple entities operating on one device, such as a single computer or a single processor. Instead the techniques may be performed by physically separate hardware that may be co-located at one facility or geographically dispersed.

Computer-readable media includes both non-transitory computer storage media and communication media including any medium that facilitates transfer of a computer program from one entity to another. Non-transitory storage media can be any available medium accessible by a computer, such as RAM, ROM, EEPROM such as flash memory, optical or compact disc ROM, and magnetic disk.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations of techniques for, and apparatuses enabling, embedding data in address streams have been described in language specific to features and/or methods, it is to be understood that the subject of the appended claims is not necessarily limited to the specific features or methods described. Rather, the specific features and methods are disclosed as example implementations enabling an exchange of data that is embedded in address streams.

What is claimed:

1. An apparatus comprising:
an interconnect configured to propagate an address stream and a data stream;
a memory device coupled to the interconnect; and
a host device coupled to the interconnect and configured to:
communicate an indication of data via the address stream of the interconnect using a preamble message in the address stream to indicate a start of a payload message including the indication of data; and
output the indication of data within the address stream as an unordered group of addresses by including, within the unordered group of addresses, at least one address that represents a checksum based on a correct order of all remaining addresses from the unordered group of addresses.

2. The apparatus of claim 1, wherein the host device is further configured to:
send addresses in the address stream communicated on the interconnect as part of a read or write request for the memory device; and
receive or send other data related to the read or write request via the data stream.

3. The apparatus of claim 1, wherein the host device is further configured to:
communicate a postamble message in the address stream indicating an end of the payload message including the indication of data.

4. The apparatus of claim 3, wherein at least one of the preamble message or the postamble message includes a pattern of offsets or a pattern of deltas between pairs of offsets.

5. The apparatus of claim 1, wherein the interconnect includes a memory bus configured to adhere to a split-transaction protocol in which physical lines of the interconnect are selectively enabled as address lines conveying the address stream or data lines conveying the data stream.

6. A method comprising:
identifying data for transmission within an address stream of an interconnect that couples a host device to a memory device and is configured to propagate the address stream and a data stream;
communicating, by the host device, an indication of the data via the address stream of the interconnect using a preamble message in the address stream to indicate a start of a payload message including the indication of data; and
outputting, by the host device, the indication of data within the address stream as an unordered group of addresses by including, within the unordered group of addresses, at least one address that represents a checksum based on a correct order of all remaining addresses from the unordered group of addresses.

7. The method of claim 6, further comprising:
sending addresses in the address stream communicated on the interconnect as part of a read or write request for the memory device; and
receiving or sending other data related to the read or write request via the data stream.

8. The method of claim 6, further comprising:
communicating a postamble message in the address stream, the postamble message indicating an end of the payload message including the indication of data.

9. The method of claim 8, wherein at least one of the preamble message or the postamble message includes a pattern of offsets or a pattern of deltas between pairs of offsets.

10. The method of claim 6, wherein the interconnect includes a memory bus configured to adhere to a split-transaction protocol in which physical lines of the interconnect are selectively enabled as address lines conveying the address stream or data lines conveying the data stream.

11. The method of claim 6, further comprising:
identifying, based on: the payload message; the preamble message; or a predetermined parameter set by the host device, a mailbox that corresponds to a dedicated page in the memory device that is reserved for communicating the data.

12. The method of claim 6, further comprising:
determining, by the memory device, that a current portion of the address stream includes an address instead of the indication of data; and
executing a read operation or a write operation based on the address included in the current portion of the address stream.

13. The method of claim 6, further comprising:
determining, by the memory device, that the current portion of the address stream includes the address instead of the indication of data by identifying a pattern of address bits indicative of the data; and
repeatedly identifying, from the address stream and during a window, the pattern of address bits.

14. An apparatus comprising:
an interconnect configured to propagate an address stream and a data stream;
a first device coupled to a memory device via the interconnect; and
a second device coupled to the interconnect and configured to detect an indication of data communicated by the first device via the address stream by:
identifying, in the address stream, a pattern of address offsets or a pattern of deltas between pairs of address offsets; and
determining, based on the pattern of address offsets or the pattern of deltas between pairs of address offsets, that a first portion of the address stream includes:
a preamble message indicating a start of a payload message with the indication of data; or
a postamble message indicating an end of the payload message; and
responsive to determining that the first portion of the address stream includes the preamble message or the postamble message, determining, from a second portion of the address stream, the payload message with the indication of data.

15. The apparatus of claim 14, wherein:
the first device comprises a host device coupled to the second device via the interconnect; and
the second device comprises the memory device and is configured to:
determine that a current portion of the address stream includes an address instead of the indication of data; and
execute a read or write operation based on the address included in the current portion of the address stream.

16. The apparatus of claim 15, wherein the second device is configured to:
determine that the current portion of the address stream includes the address instead of the indication of data by identifying a pattern of address bits indicative of the data; and
repeatedly identifying, from the address stream and during a window, the pattern of address bits.

17. The apparatus of claim 14, wherein the second device comprises a monitoring device and is configured to:
extract the indication of data from the address stream in response to detecting the indication of data; and
output the indication of data to a data file or trace-reader program that is on or executing at the monitoring device.

18. The apparatus of claim 14, wherein the second device is further configured to:
determine an expected quantity of addresses for the payload message; and
determine the payload message from a group of addresses entries in the address stream that include the expected quantity of addresses for the payload message.

19. The apparatus of claim 18, wherein the second device is further configured to:
determine, from the preamble message or the postamble message, the expected quantity of addresses for the payload message.

20. The apparatus of claim 18, wherein the second device is further configured to:
identify one or more addresses from the group of addresses as a cyclic redundancy check (CRC) checksum for correctly ordering remaining addresses in the group of addresses; and
determine the indication of data by arranging the remaining addresses in an order that satisfies the CRC checksum.

21. The apparatus of claim 14, wherein the second device is further configured to:
identify, based on the payload message, the preamble message, or a predetermined parameter set by the host device, a mailbox that corresponds to a dedicated page in the memory device that is reserved for communicating the data.

* * * * *